(12) United States Patent
Yudanov et al.

(10) Patent No.: US 12,056,599 B2
(45) Date of Patent: *Aug. 6, 2024

(54) METHODS OF PERFORMING PROCESSING-IN-MEMORY OPERATIONS, AND RELATED DEVICES AND SYSTEMS

(71) Applicant: Micron Technology, Inc., Boise, ID (US)

(72) Inventors: Dmitri Yudanov, Cordova, CA (US); Sean S. Eilert, Penryn, CA (US); Hernan A. Castro, Shingle Springs, CA (US); William A. Melton, Shingle Springs, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/061,005

(22) Filed: Dec. 2, 2022

(65) Prior Publication Data
US 2023/0107964 A1   Apr. 6, 2023

Related U.S. Application Data

(63) Continuation of application No. 16/909,632, filed on Jun. 23, 2020, now Pat. No. 11,537,861.

(51) Int. Cl.
*G06N 3/00* (2023.01)
*G06F 3/06* (2006.01)
(Continued)

(52) U.S. Cl.
CPC .......... *G06N 3/063* (2013.01); *G06F 3/0604* (2013.01); *G06F 3/0661* (2013.01);
(Continued)

(58) Field of Classification Search
CPC ... G11C 11/54; G11C 7/1006; G11C 13/0004; G11C 13/004; G11C 13/0028;
(Continued)

(56) References Cited

U.S. PATENT DOCUMENTS

| 6,484,231 B1 | 11/2002 | Kim |
| 9,430,735 B1 | 8/2016 | Vali et al. |

(Continued)

FOREIGN PATENT DOCUMENTS

| KR | 10-2014-0033937 A | 3/2014 |
| KR | 10-2017-0138143 A | 12/2017 |

(Continued)

OTHER PUBLICATIONS

Chiu et al., "A Binarized Neural Network Accelerator with Differential Crosspoint Memristor Array for Energy-Efficient MAC Operations," 2019 IEEE International Symposium on Circuits and Systems (ISCAS), 2019, pp. 1-5, doi: 10.1109/ISCAS.2019.8702128. (Year: 2019).

(Continued)

*Primary Examiner* — Thong Q Le
(74) *Attorney, Agent, or Firm* — TraskBritt

(57) ABSTRACT

Methods, apparatuses, and systems for in-or near-memory processing are described. Bits of a first number may be stored on a number of memory elements, wherein each memory element of the number of memory elements intersects a bit line and a word line of a number of word lines. A number of signals corresponding to bits of a second number may be driven on the number of word lines to generate a number of output signals. A value equal to a product of the first number and the second number may be generated based on the number of output signals.

20 Claims, 13 Drawing Sheets

(51) Int. Cl.
  *G06N 3/04*     (2023.01)
  *G06N 3/063*    (2023.01)
  *G11C 7/06*     (2006.01)
  *G11C 8/08*     (2006.01)
  *G11C 11/54*    (2006.01)
  *H03M 1/46*     (2006.01)

(52) U.S. Cl.
  CPC ............ *G06F 3/0673* (2013.01); *G06N 3/04* (2013.01); *G11C 7/06* (2013.01); *G11C 8/08* (2013.01); *G11C 11/54* (2013.01); *H03M 1/46* (2013.01)

(58) Field of Classification Search
  CPC ..... G11C 13/003; G11C 8/08; G11C 11/5678; G11C 13/0007; G11C 2213/79; G11C 7/06; G11C 11/1657; G11C 11/4074; G11C 11/5642; G11C 13/0002; G11C 13/0023; G11C 13/0026; G11C 16/0483; G11C 16/08; G11C 16/26; G11C 2013/0054; G11C 2213/71; G11C 7/1036; G11C 7/12; G11C 7/16; G11C 7/18; G11C 8/04; G11C 11/1655; G11C 11/1673; G11C 11/221; G11C 11/223; G11C 11/2259; G11C 11/2275; G11C 11/4063; G11C 11/4085; G11C 11/4094; G11C 11/56; G11C 11/5607; G11C 11/5614; G11C 11/5685; G11C 16/0425; G11C 16/0433; G11C 16/24; G11C 16/30; G11C 19/00; G11C 2013/0045; G11C 2213/72; G11C 27/005; G11C 7/1012; G11C 7/1063; G11C 7/109; G11C 8/10; G11C 8/14; G06N 3/065; G06N 3/063; G06N 3/04; G06N 3/08; G06N 3/084; G06N 3/049; G06N 3/044; G06N 3/045; G06N 3/06; G06N 3/088; G06N 5/046
  See application file for complete search history.

(56) References Cited

U.S. PATENT DOCUMENTS

| | | |
|---|---|---|
| 9,496,023 B2 | 11/2016 | Wheeler et al. |
| 9,704,540 B2 | 7/2017 | Manning et al. |
| 10,074,407 B2 | 9/2018 | Manning et al. |
| 10,249,350 B2 | 4/2019 | Manning et al. |
| 10,416,927 B2 | 9/2019 | Lea et al. |
| 10,453,499 B2 | 10/2019 | Manning et al. |
| 10,490,257 B2 | 11/2019 | Wheeler et al. |
| 10,497,442 B1 | 12/2019 | Kumar et al. |
| 10,635,398 B2 | 4/2020 | Lin et al. |
| 10,642,922 B2 | 5/2020 | Knag et al. |
| 11,537,861 B2 * | 12/2022 | Yudanov .............. G06F 3/0673 |
| 2011/0040821 A1 | 2/2011 | Eichenberger et al. |
| 2011/0153707 A1 | 6/2011 | Ginzburg et al. |
| 2012/0182799 A1 | 7/2012 | Bauer |
| 2013/0173888 A1 | 7/2013 | Hansen et al. |
| 2015/0006810 A1 | 1/2015 | Busta et al. |
| 2015/0357024 A1 | 12/2015 | Hush et al. |
| 2016/0004508 A1 | 1/2016 | Elmer |
| 2016/0099073 A1 | 4/2016 | Cernea |
| 2016/0321031 A1 | 11/2016 | Hancock |
| 2017/0277659 A1 | 9/2017 | Akerib et al. |
| 2017/0345481 A1 | 11/2017 | Hush |
| 2018/0129474 A1 | 5/2018 | Ahmed |
| 2018/0210994 A1 | 7/2018 | Wuu et al. |
| 2018/0246855 A1 | 8/2018 | Redfern et al. |
| 2018/0286468 A1 | 10/2018 | Willcock |
| 2019/0019538 A1 | 1/2019 | Li et al. |
| 2019/0035449 A1 | 1/2019 | Saida et al. |
| 2019/0042199 A1 | 2/2019 | Sumbul et al. |
| 2019/0043560 A1 | 2/2019 | Sumbul et al. |
| 2019/0080230 A1 | 3/2019 | Hatcher et al. |
| 2019/0102170 A1 | 4/2019 | Chen et al. |
| 2019/0102358 A1 | 4/2019 | Asnaashari et al. |
| 2019/0221243 A1 | 7/2019 | Manning et al. |
| 2019/0228301 A1 | 7/2019 | Thorson et al. |
| 2020/0020393 A1 | 1/2020 | Al-Shamma |
| 2020/0035305 A1 | 1/2020 | Choi et al. |
| 2020/0082871 A1 | 3/2020 | Wheeler et al. |
| 2020/0210369 A1 | 7/2020 | Song |
| 2020/0342938 A1 | 10/2020 | Tran et al. |
| 2020/0357459 A1 | 11/2020 | Zidan et al. |
| 2021/0072987 A1 | 3/2021 | Yudanov et al. |
| 2021/0104551 A1 | 4/2021 | Lin et al. |
| 2021/0110235 A1 | 4/2021 | Hoang et al. |

FOREIGN PATENT DOCUMENTS

| | | |
|---|---|---|
| KR | 10-2018-0042111 A | 4/2018 |
| KR | 10-2019-0051766 A | 5/2019 |
| WO | 2018/154268 A1 | 8/2018 |

OTHER PUBLICATIONS

International Search Report for Application No. PCT/US2021/035503, mailed Sep. 9, 2021, 3 pages.
Patterson et al., "Computer Organization and Design: The Hardware/Software Interface", Fifth Edition, Chapter 3.2 pp. 178-182, 2014. Retrieved from <https://ict.iitk.ac.in/wp-content/uploads/CS422-Computer-Architecture-ComputerOrganizationAndDesign5thEdition2014.pdf> (Year: 2014).
Written Opinion of the International Searching Authority for Application No. PCT/US2021/035503, mailed Sep. 9, 2021, 3 pages.
Yudanov et al., U.S. Appl. No. 16/717,890 titled Methods for Performing Processing-In-Memory Operations on Serially Allocated Data, and Related Memory Devices and Systems, filed Dec. 17, 2019.

* cited by examiner

METHODS OF PERFORMING PROCESSING-IN-MEMORY OPERATIONS, AND RELATED DEVICES AND SYSTEMS

CROSS-REFERENCE TO RELATED APPLICATION

This application is a continuation of U.S. patent application Ser. No. 16/909,632, filed Jun. 23, 2020, now U.S. Pat. No. 11,537,861 issued Dec. 27, 2022, the disclosure of which is hereby incorporated herein in its entirety by this reference.

TECHNICAL FIELD

Embodiments of the disclosure relate to processing-in-memory and, more specifically, to performing processing-in-memory operations. Yet more specifically, some embodiments relate to methods of performing dot product operations within a processing-in-memory capable memory device, and related memory devices, memory systems, and electronic systems.

BACKGROUND

Memory devices are typically provided as internal, semiconductor-based, integrated circuits in computers or other electronic systems. There are many different types of memory including volatile and non-volatile memory. Volatile memory, which may retrieve stored information after being power cycled, may include, among others, flash memory including NAND or NOR flash memories. Volatile memory may require power to maintain its data (e.g., host data, error data, etc.) and includes random access memory (RAM), dynamic random access memory (DRAM), static random access memory (SRAM), synchronous dynamic random access memory (SDRAM), content addressable memory (CAM), and thyristor random access memory (TRAM), among others.

Electronic systems often include a number of processing resources (e.g., one or more processors), which may retrieve and execute instructions and store the results of the executed instructions to a suitable location. A processor may include a number of functional units such as arithmetic logic unit (ALU) circuit, floating point unit (FPU) circuit, and a combinatorial logic block, for example, which may be used to execute instructions by performing an operation on data (e.g., one or more operands). As used herein, an operation may include, for example, a Boolean operation, such as AND, OR, NOT, NOT, NAND, NOR, and XOR, and/or other operations (e.g., invert, shift, arithmetic, statistics, among many other possible operations). For example, functional unit circuit may be used to perform the arithmetic operations, such as addition, subtraction, multiplication, and division on operands, via a number of operations.

A number of components in an electronic system may be involved in providing instructions to the functional unit circuit for execution. The instructions may be executed, for instance, by a processing resource such as a controller and/or host processor. Data (e.g., the data on which the instructions may be executed) may be stored in a memory array that is accessible by the functional unit circuit. The instructions and/or data may be retrieved from the memory array and sequenced and/or buffered before the functional unit circuit begins to execute instructions on the data.

DETAILED DESCRIPTION

Figure 1:
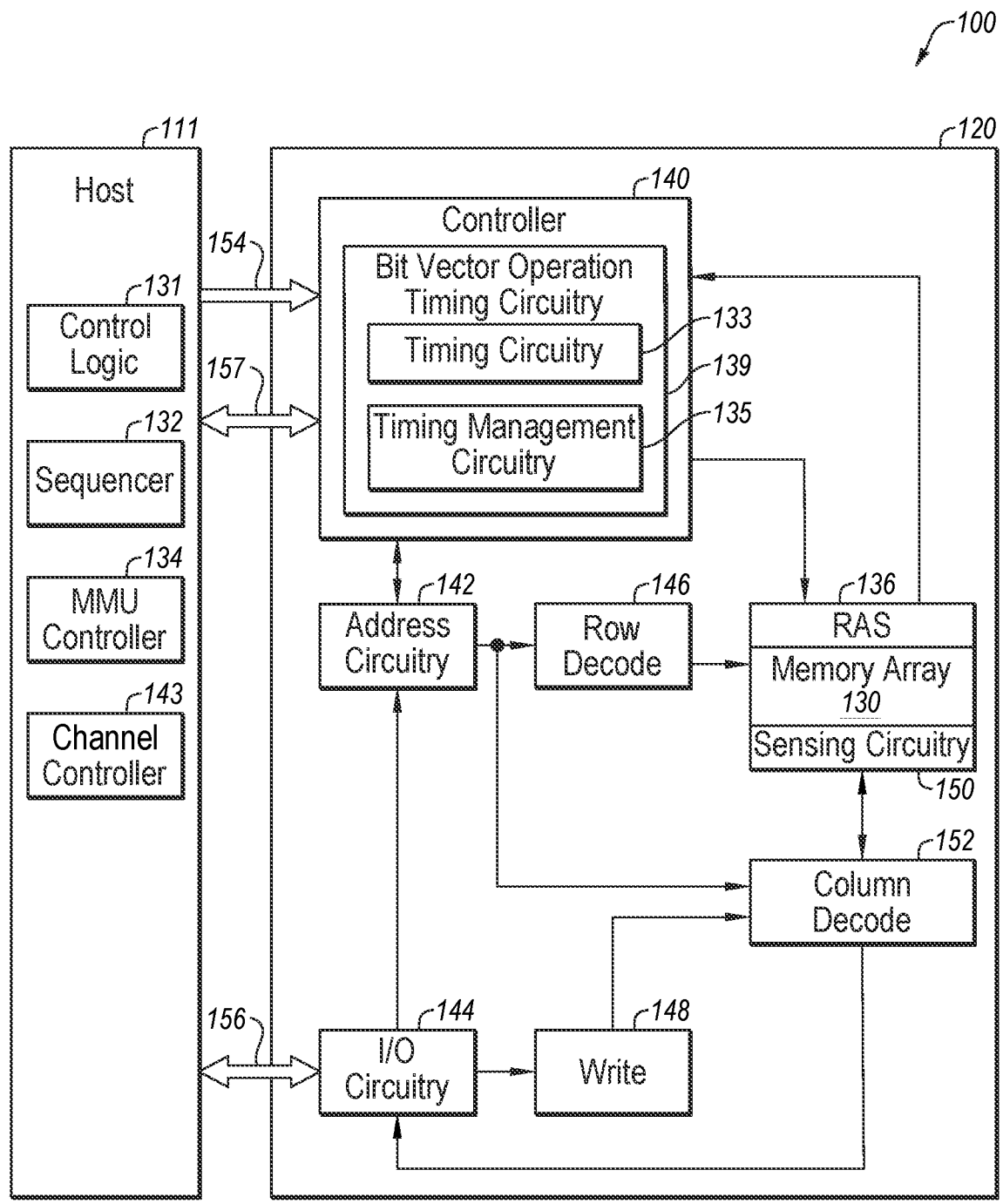
FIG. 1 is a block diagram of an example system including a memory device, in accordance with a number of embodiments of the present disclosure.

Forward propagation (also referred to as "forward pass") and backward propagation (also referred to as "backward pass") in a neural network (e.g., an artificial neural network (ANN)) may be used in various applications, such as in machine learning, image processing, artificial intelligence, system modeling (e.g., electrical systems, mechanical systems, etc.), and many others. Operations for forward and/or backward propagation may be relatively simple. However, conventional computer-based computations may involve processor and memory intensive operations, including transferring large amounts of data between compute cores and memory arrays.

In many instances, processing resources (e.g., processor and associated functional unit circuit) may be external to the memory array, and data is accessed via a bus between the processing resources and the memory array to execute a set of instructions. Processing performance may be improved in a processor-in-memory (PIM) device, in which a processor may be implemented internally and/or near to a memory (e.g., directly on a same chip as the memory array). A PIM device may save time and/or conserve power by reducing and possibly eliminating external communications.

Various embodiments of the disclosure relate to processing-in-memory (PIM) operations, and more specifically to performing PIM dot product operations (e.g., for forward and/or backward propagation (e.g., in an ANN)). In at least one embodiment, a memory device includes a memory array. The memory array includes at least one bit line, a first set of word lines intersecting the at least one bit line, and a first set of memory elements at the intersections of the at least one bit line and the first set of word lines. In some embodiments, bits of a first number are stored along a bit line (e.g., bit-serially) in the first set of memory elements. The memory device further includes a driver configured to drive a first set of signals on the first set of word lines. The first set of signals may correspond to bits of a second number, and, in some embodiments, respective values of the first set of signals may or may not be different from one another. The memory device further includes a summing circuit configured to receive output signals from the bit line and, in response to receiving the output signals from the first bit line, generate a value equal to the product of the first number and the second number.

As used herein, a processing-in memory (PIM) capable device refers to a memory device capable of performing logical and arithmetic operations on data stored in an array of memory cells using a processing resource internal to the memory device (e.g., without transferring the data to an external processing resource such as a host processor). As an example, a PIM-capable device may include a memory array coupled to sensing circuit comprising sensing components operable as 1-bit processing elements (e.g., to perform parallel processing on a per column basis). A PIM-capable device may also perform memory operations in addition to logical operations performed "in memory," which may be referred to as "bit vector operations." As an example, a PIM-capable device may include a dynamic random access memory (DRAM) array with memory operations including memory access operations such as reads (e.g., loads) and writes (e.g., stores), among other operations that do not involve operating on the data. For example, a PIM-capable device may operate a DRAM array as a "normal" DRAM array and/or as a PIM DRAM array depending on a type of program being executed (e.g., by a host), which may include both memory operations and bit vector operations. For example, bit vector operations may include logical operations such as Boolean operations (e.g., AND, OR, XOR, etc.) and transfer operations such as shifting data values in the array and inverting data values, for example. Arithmetic operations performed by a PIM device may be enabled by logical operations. For example, a single-bit addition may be enabled by a set of operations: 0+0={0-sum, 0-carry}, 0+1={1-sum, 0-carry}, 1+0={1-sum, 0-carry}, 1+1={0-sum, 1-carry}. Thus, a sum is a XOR operation, and the carry is an AND operation. In a case when more than 2 bits are summed: a sum is 1 when count of bits with value '1' is odd and sum is 0 otherwise; a carry is a count of pairs of bits where both bits in a pair have value '1'.

As used herein, a PIM operation may refer to various operations associated with performing in memory processing utilizing a PIM-capable device. An operation hierarchy may be used to define a PIM operation. For example, a first (e.g., lowest) level in the operation hierarchy may include bit vector operations (e.g., fundamental logical operations, which may be referred to as "primitive" operations). A next (e.g., middle) level in the hierarchy may include composite operations, which comprise multiple bit vector operations. For instance, composite operations may include mathematical operations such as adds, multiplies, etc., which may comprise a number of logical ANDs, ORs, XORs, shifts, etc. A third (e.g., highest) level in the hierarchy may include control flow operations (e.g., looping, branching, filtering, matching, etc.) associated with executing a program whose execution involves performing processing using a PIM-capable device.

As described in more detail herein, PIM operations may be executed by various components within a system comprising a PIM-capable device. For instance, a first PIM control component (e.g., control logic, which may be referred to as a "scalar unit"), which may be located on a host, may execute control flow operations and provide composite operations to a second PIM control component (e.g., a sequencer), which may also be located on the host or on the PIM-capable device. In a number of embodiments, the second control component may provide low level bit vector operations to a PIM control component located on the PIM-capable device (e.g., bit vector timing circuit), which may execute the bit vector operations in memory and return results to the host. As described further herein, an interface used to transfer PIM operations between a PIM-capable device and the host may include a channel, which may include a bus separate from a typical memory interface, such as a DDR interface, used to transfer commands, addresses, and/or data. Also, in a number of embodiments, providing PIM control components on the host may provide benefits such as allowing a PIM program to use virtual addressing (e.g., by resolving physical-to-virtual address translation on the host since the PIM-capable device may operate only on physical addresses, or by enabling such physical-to-virtual address translation on the PIM-capable device).

Techniques described herein may also be applicable to processing in storage (e.g., processing in NAND or NOR Flash, 3D XPoint™, or the like). PIM may also be referred to as compute in memory or compute in storage. In other words, this disclosure contemplates processing or computation in devices often associated with storing or organizing data such as memory or storage, which, in some architectures, are distinct from a CPU, GPU, GPGPU, FPGA, ASIC, or the like.

FIG. 1 is a block diagram of a system 100 including a memory device 120, in accordance with a number of embodiments of the present disclosure. Memory device 120, which may also be referred to herein as a "PIM-capable device" or "PIM-capable memory device," may include any suitable memory device. For example, memory device 120 may include volatile memory (e.g., RAM, DRAM, etc.) and/or non-volatile memory (e.g., flash memory, a crosspoint memory device such as a 3D crosspoint memory device, etc.). Memory device 120 may include a memory array 130 (i.e., including memory cells) coupled to sensing circuitry, as described in more detail below. According to some embodiments, memory device 120 may include multiple memory arrays 130 organized in banks, ranks, decks, plains, blocks, segments or some other form.

System 100 further includes a host 111 coupled to memory device 120. Host 111 may include a host system such as a personal laptop computer, a desktop computer, a digital camera, a smart phone, or a memory card reader, among various other types of hosts. Host 111 may include a system motherboard and/or backplane and may include a number of processing resources (e.g., one or more processors, microprocessors, or some other type of controlling circuitry). System 100 may include separate integrated circuits or both host 111 and memory device 120 may be part of the same integrated circuit (e.g., on a same chip). System 100 may include, for instance, a server system and/or a high performance computing (HPC) system and/or a portion thereof.

Host 111 may include various components including PIM control components (e.g., control logic 131, a sequencer 132), a channel controller 143, and a memory management unit (MMU) controller 134. Control logic 131 may be configured to execute control flow commands associated with an executing PIM program and to provide composite commands to sequencer 132. Control logic 131 may be, or may include, a RISC type controller configured to generate and issue an extensible set of composite operation PIM commands that includes commands different from DDR commands sent to sequencer 132. In some embodiments, control logic 131 may be configured to issue composite operation commands to cause bit vector operations to be performed on memory device 120. In some embodiments, the composite operation commands may be transferred from control logic 131 to memory device 120 (e.g., via sequencer 132 and channel 157).

Control logic 131 may, in some embodiments, decode microcode instructions into function calls, which may be microcode function calls, associated with performing a bit vector operation, implemented by sequencer 132. The microcode function calls may be the operations that sequencer 132 receives and/or executes to cause memory device 120 to perform particular bit vector operations using the sensing circuitry, such as sensing circuitry 150.

As shown in FIG. 1, control logic 131 and MMU controller 134 are located on host 111, which may allow for control logic 131 and/or MMU controller 134 to access virtual addresses stored on host 111 and perform virtual to physical address resolution (e.g., translating a virtual address of an address space associated with an application running on the host 111 with actual physical address of the memory device 120) prior to transferring instructions to memory device 120. The translation may be performed at a host by looking up address translation tables stored in memory device 120 (e.g., page tables) or by performing the same on memory device 120. In some embodiments, control logic 131 and/or sequencer 132 are located in memory device 120, for instance in controller 140 or in row decoder 146. In other embodiments, control logic 131, sequencer 132, or MMU controller 134 may be distributed such that part of their functionality is located on host 111 and another part on memory device 120.

As used herein, a "bit vector" may refer to a physically contiguous number of bits, whether physically contiguous in rows (e.g., horizontally oriented) or columns (e.g., vertically oriented). A PIM-capable device may be configured to perform bit vector operations such as logical operations and/or transfer operations on a number of contiguous portions (e.g., "chunks") of virtual address space. For example, a chunk of virtual address space may have a bit length of 256 bits. A chunk may or may not be contiguous sequentially to other chunks in the virtual address space, however, it will be contiguous within a scope of a memory page. In disclosed embodiments, A PIM capable device may be configured to perform the said operations in virtual address space after translation of virtual addresses of virtual pages to physical addresses of physical pages.

MMU controller 134, which may reside on host 111 (as shown in FIG. 1), may be responsible for performing the translation of virtual memory addresses (e.g., addresses associated with the host 111) to physical addresses (e.g., addresses associated with the memory device 120). MMU controller 134 may also perform memory protection operations, cache control, and/or bus arbitration operations.

Timing circuitry 133 may provide timing to coordinate performance of logical operations and may be responsible for providing conflict free access to arrays, such as memory array 130 in FIG. 1. In various embodiments, controller 140 and/or the timing management circuitry 135 may generate status information, which may be transferred to or from host 111, for example via channel 157. Channel 157 may be independent of (e.g., separate from) a double data rate (DDR) memory interface (e.g., control bus 154) that may be used to transfer (e.g., pass) DDR commands between host 111 and memory device 120. That is, in some embodiments, channel 157 may be used to transfer commands between a host 111 and a memory device 120, a memory access device, or another memory interface. Non-limiting examples of a memory interface include a double data rate (DDR) memory interface, a peripheral component interconnect express (PCIe) memory interface, a coherent accelerator processor interface (CAPI), compute express link (CXL), cache coherent interconnect for accelerators (CCIX), and combinations and subcombinations of the foregoing, without limitation.

As a non-limiting example, a DDR memory interface (e.g., control bus 154) may be used to transfer (e.g., pass) DDR commands between host 111 and memory device 120. That is, in some embodiments, channel 157 may be used to transfer commands to cause performance of bit vector operations from host 111 to memory device 120, while control bus 154 may be used to transfer DRAM commands (or commands of another type of memory interface) from host 111 to memory device 120. In some embodiments, the DRAM commands (or other types of commands) that are transferred via control bus 154 may be commands to control operation of DRAM (or commands to control other types of memory, memory access devices, or memory interfaces) such as DDR1 SDRAM, DDR2 SDRAM, DDR3 SDRAM, DDR4, DDR5 and other versions of a DDR type protocol, without limitation. In other embodiments, memory device 120 may signal to host about readiness of operations via channel 157. In some embodiments, channel 157 is combined with control bus 154 and/or data bus 156. Further, in some embodiments, host 111 may include multiple memory devices 120 with multiple channels and/or control buses.

In some embodiments, sequencer 132 may include a very large instruction word (VLIW) type controller configured to operate on logical operation commands and control logic 131 may be configured to issue the logical operation commands to sequencer 132 in response to a signal from a processing resource (not shown) of host 111. For example, sequencer 132 may be configured to sequence multiple logical operations such that composite operation commands may be issued by sequencer 132. Control logic 131 may, in some embodiments, be configured to generate an executable instruction such as a VLIW type instructions or an SMID type instructions. In an embodiment including a VLIW type instruction controller, control logic 131 may be configured to generate a VLIW as a bit vector operation command(s). The VLIW may comprise microcode instructions. Sequencer 132 may be, or may include, the VLIW type controller configured to decode the VLIW into a plurality of separate microcode instructions. For example, sequencer 132 may decode the VLIW into instructions to cause performance of composite operations (e.g., ADD, MULTIPLY, DOT PRODUCT, without limitation). In some embodiments, the composite operation commands may provide an entry point into a sequence of VLIW instructions to cause perform such composite operations. In an embodiment including an SMID type instruction controller, control logic 131 may be configured to generate a unit of data, such as a vector of data, without limitation, and sequencer 132 may cause execution of a single instruction in parallel on multiple data points identified in the unit of data.

Sequencer 132 may be coupled to memory device 120 and may pass commands to coordinate bit vector operations to memory device 120 via channel 157. Microcode instructions may be executable in sequence and/or in parallel by sequencer 132 itself and/or by other components in the memory device 120 (e.g., bit vector operation timing circuitry 139, timing circuitry 133, timing management circuitry 135, and/or sensing circuitry 150). Memory array 130 may include a DRAM array, SRAM array, STT RAM array, PCRAM array, TRAM array, RRAM array, NAND flash array, and/or NOR flash array, for instance. Memory array 130 may include memory cells arranged in rows coupled by access lines, which may be referred to herein as word lines or select lines, and columns coupled by sense lines, which may be referred to herein as data lines, digit lines, or bit lines. Although a single memory array is shown in FIG. 1, embodiments are not so limited. For instance, memory device 120 may include a number of memory arrays 130 (e.g., a number of banks of DRAM cells, NAND flash cells, etc.).

Memory device 120 includes address circuitry 142 to latch address signals for data provided over a bus 156 (e.g., a data/address bus) through I/O circuitry 144. Status and/or exception information may be provided from controller 140 on memory device 120 to a channel controller 143, through an interface (e.g., a high speed interface (HSI)) including channel 157. Address signals are received through address circuitry 142 and decoded by a row decoder 146 and a column decoder 152 to access memory array 130. Data may be read from memory array 130 by sensing the state of memory cells on the digit lines using sensing circuitry 150. The state of memory cells may be sensed as, for example, voltage and/or current changes, magnetic state changes, resistivity, and quantum state, and so on, depending on the memory cell technology. Sensing circuitry 150 may read and latch a page (e.g., row) of data from memory array 130. I/O circuitry 144 may be used for bi-directional data communication with host 111 over data bus 156. Write circuitry 148 can be used to write data to memory array 130. In some embodiments, write circuitry 148 is combined with sensing circuitry 150. In other embodiments, sensing circuitry 150 can be a part of column decoded 152 and/or row decoder 146. In some embodiments, control bus 154 may serve as both a control and address bus for DRAM control and addressing (e.g., in accordance with a DDR protocol in which control bus 154 operates as a unidirectional data bus). Although shown as separate buses in FIG. 1, in some embodiments, control bus 154 and data bus 156 may not be separate buses. Controller 140 (e.g., memory controller) may decode signals provided by control bus 154 from host 111. These signals can include chip enable signals, write enable signals, and address latch signals that are used to control DRAM operations performed on memory array 130, including data read, data write, and data erase operations. In various embodiments, controller 140 may be responsible for executing instructions from host 111 and sequencing access to memory array 130. Controller 140 may include a state machine, sequencer, or some other type of controller and include hardware and/or firmware (e.g., microcode instructions) in the form of an application specific integrated circuit (ASIC). In a number of embodiments, controller 140 may include bit vector operation timing circuitry 139. Controller 140 may control, for example, sensing circuitry 150. For example, controller 140 may control generation of clock signals and application of the clock signals to compute components in association with performing bit vector operations.

As shown in FIG. 1, bit vector operation timing circuitry 139 may include timing circuitry 133 and timing management circuitry 135. Timing circuitry 133 may include a FIFO buffer to provide timing coordination with sensing circuitry 150 associated with memory array 130 of memory cells. In some embodiments, timing circuitry 133 may include a state machine, such as an atomic state machine.

Timing management circuitry 135 may be configured to coordinate timing of logical operations (e.g., a sequence of logical operations), associated with the bit vector operation, performed using a row address strobe (RAS)/column address strobe (CAS) component 136 associated with memory array 130. RAS component 136 may be configured to send and/or receive a signal (e.g., RAS/CAS signal) to or from memory array 130 to identify and/or select a row and/or column address of memory array 130. Memory device 120 may, in some embodiments, be configured to execute a DRAM operation such as a memory array access request, which may be issued by host 111 via bus 154. In some embodiments, timing management circuitry 135 may be configured to execute instructions to control timing of performance of a bit vector operation.

In one or more embodiments, portions of controller 140, (e.g., bit vector operation timing circuitry 139, timing circuitry 133, and/or timing management circuitry 135), may include a reduced instruction set computer (RISC) type controller operating on, for example, 32 and/or 64 bit length instructions. In various embodiments, timing management circuitry 135 may be responsible for executing instructions received from timing circuitry 133 to cause performance of bit vector operations involving data values associated with sensing circuitry 150.

As described further below, in a number of embodiments, sensing circuitry 150 may include a plurality of sensing components, which can each include a sense amplifier and a compute component. The compute component may serve as an accumulator, and sensing circuitry 150 may be used to perform bit vector operations (e.g., on data associated with complementary digit lines). In a number of embodiments, sensing circuitry 150 may be used to perform bit vector operations using data stored in memory array 130 as inputs and/or store the results of the operations back to the memory array 130 without transferring data via a digit line address access (e.g., without firing a column decode signal). For instance, various operations (e.g., bit vector operations) may be performed using, and within, sensing circuitry 150 rather than (or in association with) being performed by processing resources external to sensing circuitry 150 (e.g., by a processing resource associated with host 111 and/or other processing circuitry, such as ALU circuitry, located on memory device 120 (e.g., on controller 140 or elsewhere)). In a number of embodiments, sensing circuitry 150 (e.g., the number of sensing components) may be used to execute bit vector operations in a SIMD (single instruction multiple data) manner with the sensing components serving as 1-bit processing elements on a per column basis. In embodiments in which sensing circuitry 150 executes bit vector operations, sensing circuitry 150 may serve as and/or be referred to as an "in memory processor." As described more fully below, in some embodiments, sensing circuitry 150 may include a sequencer (e.g., similar to sequencer 132). In other embodiments, neighboring sensing components may exchange data bits amongst each other, thus producing computation based on multiple data sources. In other embodiments, sensing components may produce different computation depending on their location within sensing circuitry 150, thus, providing computation in VLIW or SIMD manner. In embodiments in which sensing circuitry 150 executes bit vector operations, sensing circuitry 150 may serve as and/or be referred to as an "in memory processor." As described more fully below, in some embodiments, sensing circuitry 150 may include a sequencer (e.g., similar to sequencer 132).

In various approaches, data associated with an operand, for instance, may be read from memory via sensing circuitry and provided to external memory array ALU circuitry via I/O lines (e.g., via local I/O lines and/or global I/O lines). The external memory array ALU circuitry may include a number of registers and would perform bit vector operations using the operands, and the result may be transferred back to the array via the I/O lines. In other embodiments, sensing circuitry 150 is configured to perform bit vector operations on data stored in memory array 130 and store the result back to the memory array 130 without enabling an I/O line (e.g., a local I/O line) coupled to sensing circuitry 150.

In a number of embodiments, circuitry external to memory array 130 and sensing circuitry 150 may not be needed to perform operations as sensing circuitry 150 may perform the appropriate bit vector operations without the use of an external processing resource. Therefore, sensing circuitry 150 may be used to complement and/or to replace, at least to some extent, such an external processing resource (or at least the bandwidth consumption of such an external processing resource). However, in a number of embodiments, sensing circuitry 150 may be used to perform logical operations (e.g., to execute instructions) in addition to logical operations performed by an external processing resource (e.g., host 111). For instance, host 111 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to performing logical operations using sensing circuitry (e.g., sensing circuitry 150) without enabling column decode lines of the array. Whether or not local I/O lines are used in association with performing logical operations via sensing circuitry 150, the local I/O line(s) may be enabled to transfer a result to a suitable location other than back to memory array 130 (e.g., to an external register).

Various embodiments of the disclosure relate to performing PIM operations, and more specifically to performing PIM dot product operations for forward propagation and/or backward propagation (e.g., in an ANN). According to various embodiments described herein, in an ANN, weighted input signals from source neurons are routed to destination neurons via one or more PIM operations. For example, an ANN may be emulated, at least in part, by performing PIM operations on one or more resistive memory arrays. Additionally, and more specifically, accordingly to various embodiments described herein, in an ANN, PIM operations are performed to, among other things, perform forward propagation in an ANN based one weighted inputs, and perform backward propagation in an ANN based on weighted errors.

Figure 2:
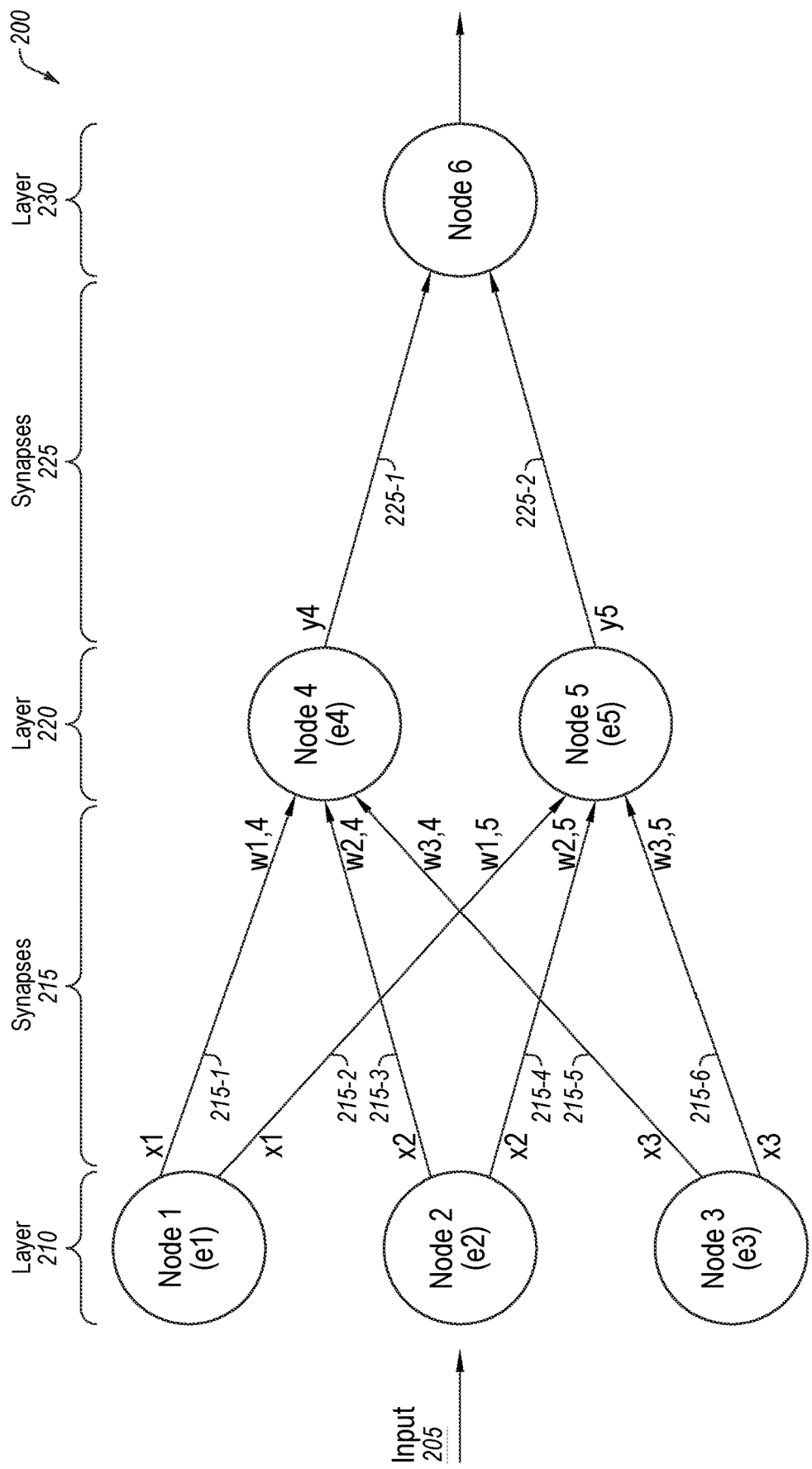
FIG. 2 illustrates an example artificial neural network, according to various embodiments of the present disclosure.

FIG. 2 depicts an embodiment of an ANN 200 that includes multiple layers (or levels) of neurons. ANN 200 includes: (1) a layer 210 of neurons (also referred to herein as "nodes") that includes Node 1, Node, 2 and Node 3; (2) a layer 220 that includes Node 4 and Node 5; and (3) a layer 230 that includes Node 6. The neurons in respective layers are connected to one another via synapses (also referred to as "synaptic connections"). For example, neurons in layer 210 are connected to neurons in layer 220 via synapses 215, and neurons in layer 220 are connected to neurons in layer 230 via synapses 225. For the sake of brevity and clarity, only three levels of neurons are depicted in ANN 200. However, ANN 200 may include any number of levels of neurons. Additionally, each level of neurons may include any number of neurons. For example, any level of ANN 200 may include thousands of neurons, where each neuron in a first layer, such as layer 210, has a synapse (or synaptic connection) with each neuron in a next layer, such as layer 220. In such an example, synapse 215-1 connects Node 1 and Node 4, synapse 215-2 connects Node 1 and Node 5, synapse 215-3 connects Node 2 and Node 4, synapse 215-4 connects Node 2 and Node 5, synapse 215-5 connects Node 3 and Node 4, and synapse 215-6 connects Node 3 and Node 5.

Each neuron in layer 210 may receive a respective input 205 from a number of neurons in a previous layer (not shown) of ANN 200. Upon receiving input 205, neurons in layer 210 generate respective outputs transmitted along respective synapses 215 to respective neurons in layer 220. The output of neurons in layer 210 are received at respective neurons in layer 220. For example, upon Node 1 receiving an input, Node 1 generates a signal x1. Similarly, upon Node 2 receiving an input, Node 2 generates a signal x2, and upon Node 3 receiving an input, Node 3 generates signal x3.

Additionally, according to some embodiments, synapses in an ANN, upon receiving the output signals from neurons in one layer, may scale the signals according to adjustable synaptic weights. As such, the synapses may provide combined scaled signals as an input signal(s) to neurons in a subsequent or destination layer. For example, signal x1, generated by Node 1 and transmitted to Node 4 along synapse 215-1, is scaled by synaptic weight w1,4. Signal x2, generated by Node 2 and transmitted to Node 4 along synapse 215-3, is scaled by synaptic weight w2,4. Signal x3, generated by Node 3 and transmitted to Node 4 along synapse 215-5, is scaled by synaptic weight w3,4. Accordingly, a destination neuron, such as Node 4, may generate an output signal (e.g., signal y4) based on the corresponding combined input signals from nodes (neurons) in layer 210. The output signals (e.g., signal y4) are transmitted to another level or layer of neurons (e.g., Node 6) using another network of synapses (e.g., synapses 225) in ANN 200. In embodiments of an ANN where each-to-each neuron connection is not needed or in which a number of neurons from layer to layer may be different, a respective not needed synapse of a relevant neuron in the current layer can be programmed to 0 or other terminal value that is not allowing to pass a signal from undesired neuron of the previous layer to the relevant neuron in the current layer.

According to some embodiments, an output of a neuron in a layer is a dot product of weight vectors (e.g., synaptic weights of a neuron) and input vectors (e.g., input signals to a neuron) from previous layers, as provided by the following equation:

$$y = F(x \cdot w); \quad \text{(Equation 1)}$$

wherein y is the output signal of a neuron in a layer, F is a non-linear function, x is the input vector from a previous layer, and w is the weight vector of a neuron in a current layer. Each neuron in a current layer may have a unique to it weight vector.

Accordingly, an output of Node 4 (or neuron 4) is y4, where y4 is a dot product of a weight vector (e.g., synaptic weights) and input vector (e.g., input signals) from neurons (e.g., Node 1, Node 2 and Node 3) in layer 210. Referring to FIG. 2, the output, y4, of Node 4 is provided by the following equation:

$$y_4 = F(x_1 w_{(1,4)} + x_2 W_{(2,4)} + X_3 W_{(3,4)}).  \quad \text{(Equation 2)}$$

Similarly, the output, y5 of Node 5 (or neuron 5), is provided by the following equation:

$$y_5 = F(x_1 w_{(1,5)} + X_2 W_{(2,5)} + X_3 W_{(3,5)}). \quad \text{(Equation 3)}$$

As will be described in further detail herein, ANNs (such as ANN 200) may be emulated, at least in part, by performing PIM operations using one or more memory arrays (e.g., memory array 130).

According to some embodiments, forward pass in an ANN layer may include a number of dot product operations. The dot products are inputs to each neuron in a layer multiplied by a connection weight (e.g., see equations 2 and 3). The result of a dot product may be evaluated by some non-linear function (see equation 1). According to various embodiments, this process may be performed by a memory architecture (e.g., a crosspoint memory array architecture or alike). For example, a sense amp (or op-amp) may compute the non-linear function of a neuron, and the neuron weights may be allocated on a bit line. Additionally, each weight may be represented by 'n' bits (memory cells).

Figure 3:
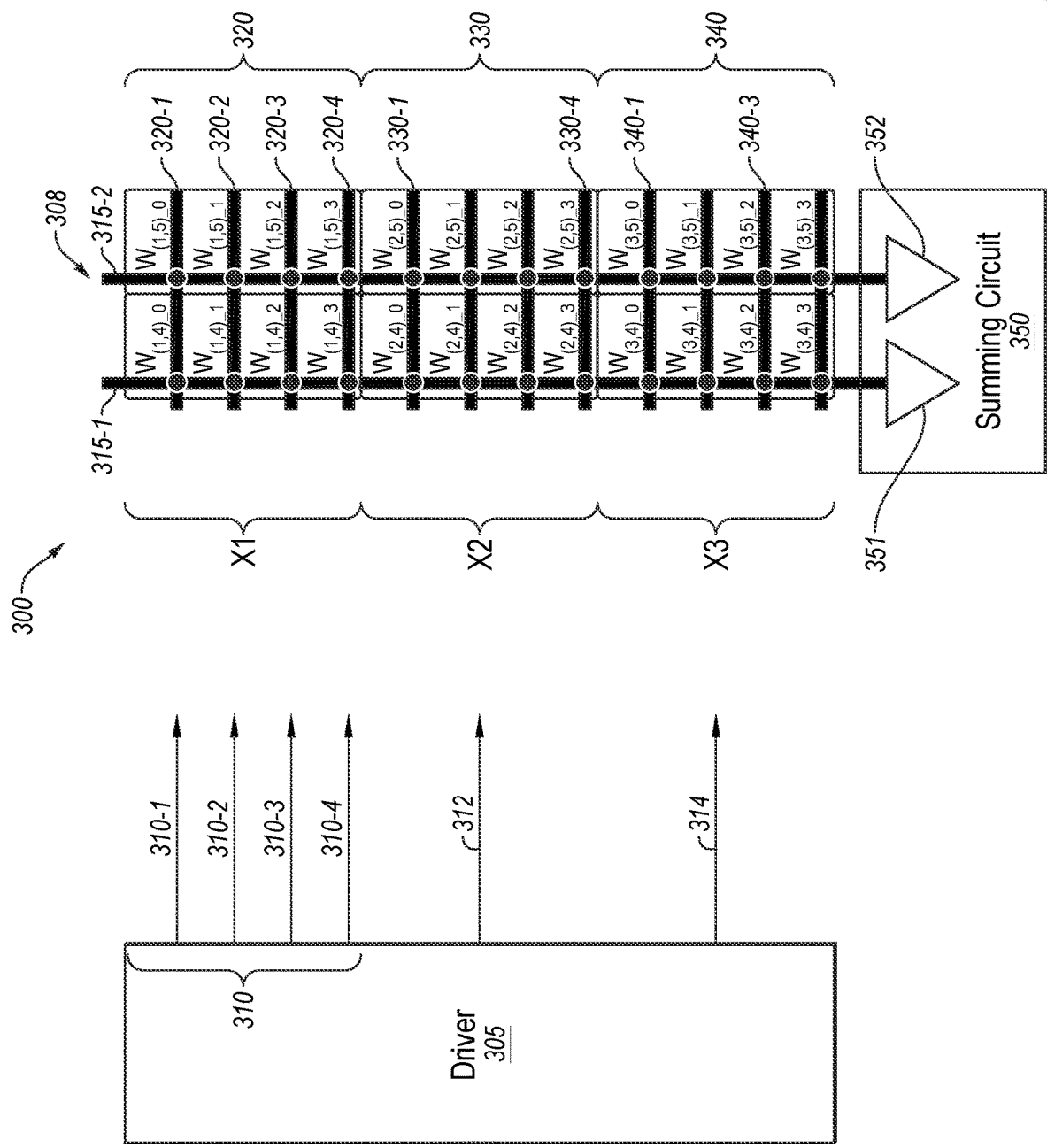
FIG. 3 illustrates an example device for performing one or more operations, according to various embodiments of the present disclosure.

FIG. 3 illustrates an example device 300 for processing operations, according to various embodiments of the disclosure. Device 300 is configured for performing PIM operations, such as calculating a dot product of weight vectors (e.g., synaptic weights) and input vectors (e.g., input signals) of layers in a neural network (e.g., a ANN). For example, device 300 may perform dot product operations for forward pass and/or backward pass operations of a neural network. In at least some embodiments, device 300 may include at least a portion of a memory device including at least one memory array and possibly additional circuitry.

Device 300 includes a memory array (also referred to herein as a "resistive memory array") 308 that includes a number of word lines (e.g., word lines 320, word lines 330, and word lines 340) (also referred to herein as "access lines") intersecting a number of bit lines (e.g., bit line 315-1 and bit line 315-2) (also referred to herein as "data lines" or "digit lines."). As will be appreciated, a memory array may be configured to change a resistance (or conductance, which is inverse of resistance) across a solid-state material of a memory cell or associated with a memory cell. For example, an element or memory cell (e.g., a memristor, PCM cell, fin FET cell, Flash memory cell and other types of memory cells that can be programmed with different resistance of conductance states) may exist at each intersection of word lines and bit lines of memory array 308. Although device 300 is depicted as having one memory array 308, device 300 may include any suitable number (e.g., two, five, eight, ten, etc.) of memory arrays. Further, memory array 308 may include any suitable type of memory cells having any suitable conductance and/or resistance.

In various embodiments, bits of one or more numbers (e.g., neuron weights of an ANN (e.g., ANN 200 of FIG. 2)) are allocated on one or more bit lines of device 300. In some embodiments, each weight associated with a particular neuron of a layer of the ANN is stored on a single bit line. For example, weights, w(1,4), w(2,4) and w(3,4) corresponding to a first neuron (e.g., Node 4 of FIG. 2) are stored bit-serially (i.e., along a bit line as opposed to along a word line) on bit line 315-1. More specifically, weights, w(1,4), w(2,4) and w(3,4) are stored on memory cells at the intersection of bit line 315-1 and word lines 320, 330 and 340, respectively. In particular, if weight w(1,4) has a value of 9 (i.e., a binary value of 1001), w(1,4)_0 has a bit value 1 stored at a memory cell at the intersection bit line 315-1 and word line 320-1, w(1,4)_1 has a bit value of 0 stored at a memory cell at the intersection of bit line 315-1 and word line 320-2, w(1,4)_2 has a bit value of 0 stored at a memory cell at the intersection of bit line 315-1 and word line 320-3, and w(1,4)_3 has a bit value of 1 stored at a memory cell at the intersection of bit line 315-1 and word line 320-4.

Similarly, weights, w(1,5), w(2,5) and w(3,5) corresponding to a second neuron (e.g., Node 5 of FIG. 2) are stored bit-serially (i.e., along a bit line as opposed to along a word line) on bit line 315-2. More specifically, weights, w(1,5), w(2,5) and w(3,5) are stored on memory cells at the intersection of bit line 315-2 and word lines 320, 330 and 340, respectively. In various embodiments, storing respective weights of a neuron on a single bit line allows for computation of a dot product for the neuron on a single bit line. Further, as will be appreciated, dot products for a number of neurons may be computed in parallel via a number of bit lines.

Device 300 also includes a driver 305 coupled to the word lines of memory array 308. Driver 305 is configured to drive signals (e.g., voltage or current signals of a DC or AC type) on respective word lines. For example, driver 305 is configured to: (1) drive signals 310 (e.g., signals corresponding to signal x1, transmitted from Node 1 to Node 4 and Node 5 of ANN 200 of FIG. 2) on word lines 320; (2) drive signals 312 (e.g., signals corresponding to signal x2, transmitted from Node 2 to Node 4 and Node 5 of ANN 200) on word lines 330; and (3) drive signals 314 (e.g., signals corresponding to signal x3, transmitted from Node 3 to Node 4 and Node 5 of ANN 200) on word lines 340.

Device 300 also includes a summing circuit 350 coupled to one or more bit lines. In particular, summing circuit 350 includes one or more amplifiers (e.g., operational amplifiers (also referred to as "op amps") or sense amplifiers) coupled to the bit lines. More specifically, summing circuit 350 includes an amplifier 351 coupled to bit line 315-1 and amplifier 352 coupled to bit line 315-2. Various example summing circuits are described below.

Device 300, in various embodiments, calculates a dot product of weights (w) and signals (x), based in part, via: (1) driver 305 providing signal coding (voltage or current signal coding in AC or DC form); and (2) summing circuit 305 summing signals received on respective bit lines. For example, voltage coding may be used to extract each weight associated with a node that is stored bit-serially on a bit line (i.e., along a bit line as opposed to along a word line).

Specifically, the voltage signal coding includes a number of voltage levels corresponding to the number of bits in the weight representation (e.g., four voltage levels for a 4-bit weight). The lowest voltage level may correspond to a least significant bit (LSB) and the highest voltage level may correspond to a most significant bit (MSB). For example, from LSB to MSB, each consecutive voltage level may be twice as high as a previous voltage level (e.g., "power of 2" rule).

In at least one embodiment, driver 305 drives voltage signals (having respective voltage levels) on corresponding word lines coupled to memory cells on a bit line. As a result, the output voltages of driver 305 are a binary-weighted sum of voltage-coded inputs on relevant word lines, where weights (e.g., weighted sum) are conductance values of memory cells (G=1/R, where G is conductance of the memory cells and R is resistance of the memory cells). Since conductance values are binary, the conductance values either permit or do not permit the voltage levels to pass through the resistive network (assuming unit conductance of 1 or 0, i.e., On or Off). Thus, when the voltage levels are applied to a stored bit sequence representing a single neuronal weight, the result is a unique output voltage that corresponds to that weight.

In a 4-bit example (e.g., the binary value of the weight has four bits), a 4-bit pattern yields 2^4 unique possible combinations. If the voltage encoding follows the "power of 2" rule, the sum (output voltage equation) is unique for each combination of stored bits yielding a unique output voltage. With a 4V range and 2^4 combinations, the LSB unit value is 0.25V, where the first voltage level is 1 LSB=0.25V, the second voltage level is 2 LSBs=0.50V, the third voltage level is 4 LSBs=1.00V, and the fourth voltage level is 8 LSBs=2.00V. It should be appreciated that voltage encoding described herein may be substituted with current encoding. Alternatively, DC for of voltage levels can be substituted with AC form, such as frequencies of certain Hz or duty cycle or phase. Same applies to the current coding (either DC or AC form).

As will be described in further detail herein, voltage encoding may be used as a building block to determine a dot product. A dot product may be determined, in general, by multiplication of two numbers (e.g., multiplication input signals and synaptic weights) with consequent summing of multiplication results. First, an input signal x_k, (a signal from a first node in a first layer to a second node in a second layer) is converted into a sequence of voltage levels (e.g., voltage encoding). The bit values from signal x_k are sequenced from LSB to MSB. As such, when a bit value of x_k is '1', all voltage levels are driven on respective word lines to the weights stored on respective bit lines. In contrast, when a bit value of x_k is '0', none of the voltage levels are driven on the word lines to the weights (high impedance case). As a result, the amplifiers in summing circuit 350 either receive an output voltage Vout that represents the stored weight (e.g., when x_k is '1') or do not receive an output voltage (e.g., when x_k is '0'). In at least one embodiment, an analog-to-digital converter (ADC) (e.g., couplable to each of the amplifiers of summing circuit 350 or a part of summing circuit 350) captures and converts the output voltage Vout provided by the amplifiers from analog to digital form.

For example, if weight, w(1,4)=1001 (i.e., 9), the corresponding voltage is 0.25V+2.00V=2.25V (0.25V corresponds to bit 0 voltage level and 2.00V corresponds to bit 3 voltage level). Suppose x1=0101 (i.e., 5) is applied to the weight w(1,4), the voltage sequence at an amplifier is 2.25V at CLK1, 0V at CLK2, 2.25V at CLK3, and 0V at CLK4 (each clock cycle corresponds to each bit of x1=0101 starting from LSB (right-most bit) as the CLK1 and marching to MSB (left-most bit) as the CLK3). The expected result from the voltage sequence is to convert results of the voltage sequence into 5 multiplied by 9=45.

Figure 4A:
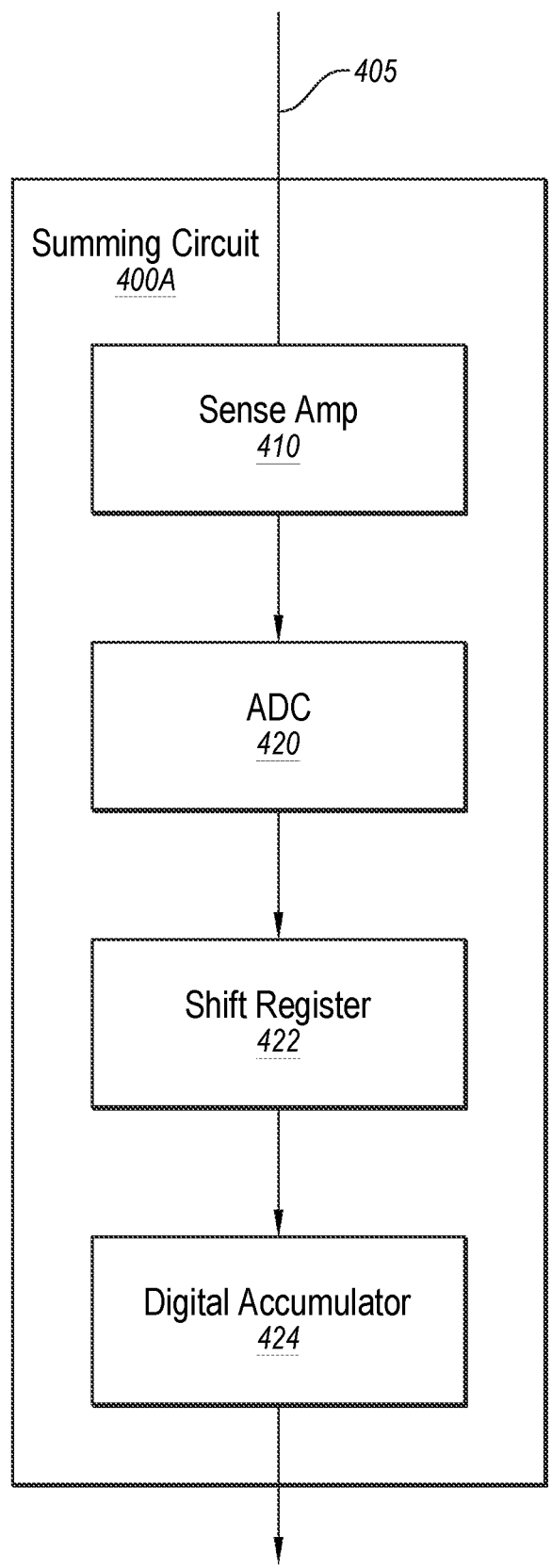
FIG. 4A illustrates an example summing circuit, in accordance with a number of embodiments of the present disclosure.

FIG. 4A illustrates an example summing circuit 400A, according to various embodiments of the disclosure. Summing circuit 400A includes a sense amp 410, an ADC 420, a shift register 422, and a digital accumulator 424. Sense amp 410 is coupled to and receives output signals from bit line 405 (e.g., bit line 315-1 and/or bit line 315-2 in FIG. 3). In some embodiments sense amp may be a part of ADC. Summing circuit 400A may be configured to implement the "power of 2" rule to generate a value (e.g., of a dot product). For example, at CLK1 (where bit 0 of x1 has a bit value of '1'), Vout of sense amp 410 is 2.25V, which is converted to 1001 by ADC 420. The binary value 1001 is shifted by 0 by shift register 422 to 0001001, and the binary value of 0001001 is stored in digital accumulator 424.

At CLK2 (where bit 1 of signal x1 has a bit value of '0'), Vout of sense amp 410 is 0V, which is converted to 0000 by ADC 420. The binary value 0000 is shifted by 1 by shift register 422 to 0000000. The binary value of 0000000 is accumulated with a previous value in digital accumulator 424, resulting in 0001001.

At CLK3 (where bit 2 of signal x1 has a bit value of '1'), Vout of sense amp 410 is 2.25V, which is converted to 1001 by ADC 420. The binary value 1001 is shifted by 2 by shift register 422 to 0100100. The binary value of 0100100 is accumulated with a previous value in digital accumulator 424, resulting in 0101101.

At CLK4 (where bit 3 of signal x1 has a bit value of '1'), Vout of sense amp 410 is 0V, which is converted to 0000 by ADC 420. The binary value 0000 is shifted by 3 by shift register 422 to 0000000. The binary value of 0000000 is accumulated with a previous value in digital accumulator 424, resulting in 0101101, which corresponds to 45 (i.e., 5×9).

Figures 4B, 4C:
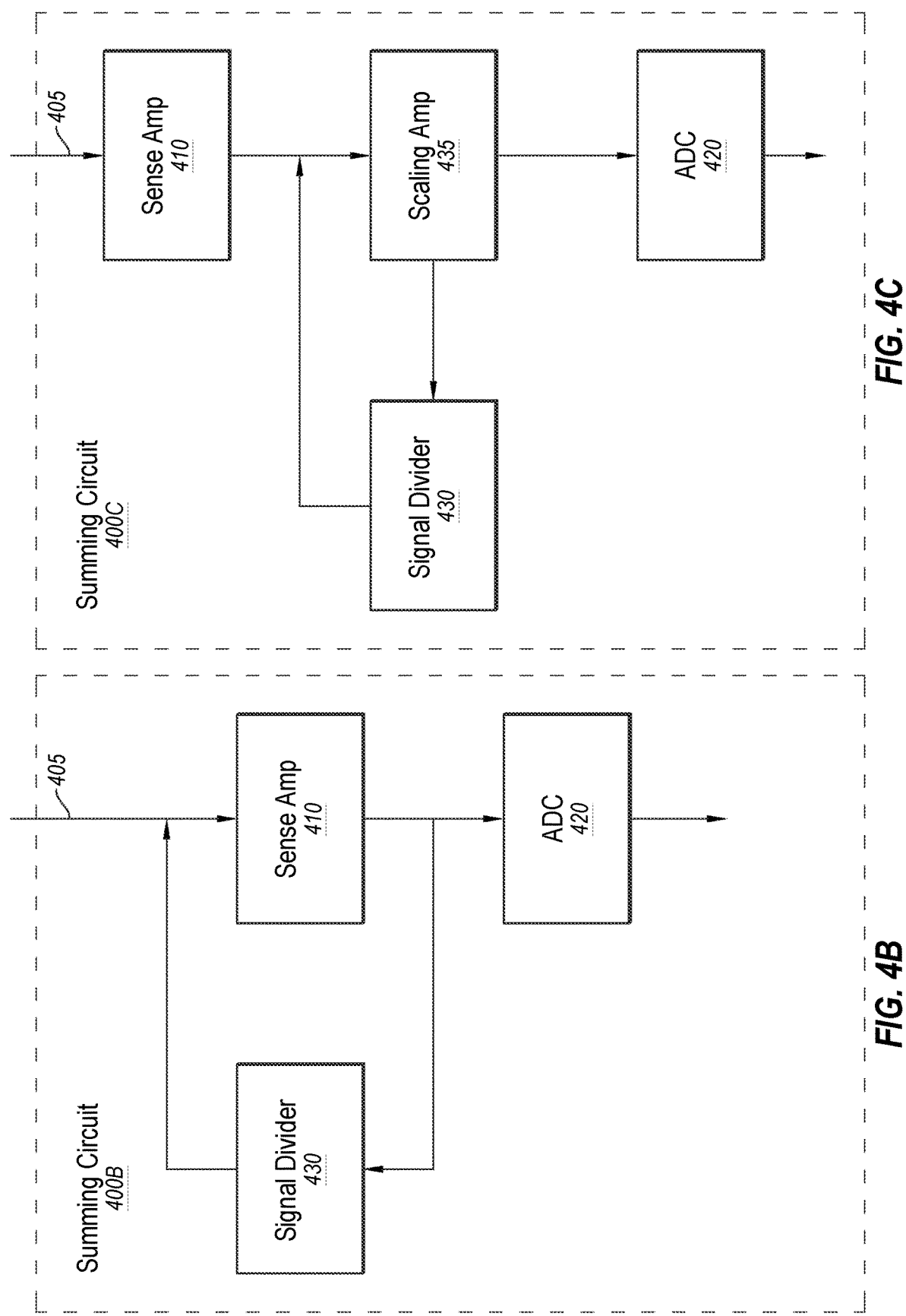
FIG. 4B illustrates another example summing circuit, in accordance with a number of embodiments of the present disclosure.
FIG. 4C illustrates another example summing circuit, according to various embodiments of the present disclosure.

FIG. 4B illustrates another example summing circuit 400B, in accordance with various embodiments of the disclosure. Summing circuit 400B includes sense amp 410 coupled to bit line 405 (e.g., bit line 315-1 and/or bit line 315-2 in FIG. 3), ADC 420 coupled to an output of sense amp 410, and a signal divider (e.g., a voltage divider with optional signal storage element and signal delay element) 430 coupled to the output of sense amp 410 and to bit line 405. In some embodiments, sense amp 410 may be a part of ADC. According to various embodiments, summing circuit 400B may implement the "power of ½ rule" for generating a value of a dot product. With this rule, a running accumulated voltage value is divided by 2 (by signal divider 430) at every subsequent clock cycle and fed back to bit line 405 before being received at sense amp 410. For example, the output of signal divider 430 is fed back to bit line 405 at every clock cycle. Alternatively, the signal divider is coupled to ADC and outputs its signal into connection between ADC and sense amp 410.

In this example, at CLK1, 0V/2+2.25V=2.25V is output by sense amp 410. At CLK2, 2.25V/2+0V=1.125V is output by sense amp 410. At CLK3, 1.125V/2+2.25V=2.8125V is output by sense amp 410. At CLK4, 2.8125V/2+0V=1.40625V is output by sense amp 410.

It is noted division may be easily implemented in analog by resistor-based or transistor-based signal divider 430, which is coupled to bit line 405 at the input of sense amp 410. Division of the result by the scaled LSB unit voltage level value corresponds to: 1.40625V/(0.25V/2^3)=45. The LSB unit voltage level is scaled down value by 2^3 because the values were divided by 2 three separate times. This may be practical to some extent as long as ADC 420 may recognize LSB unit value. In this 4-bit example with 4V rail-to-rail: 0.25V/2^3=31.25 mV.

FIG. 4C illustrates another example summing circuit 400C, in accordance with various embodiments of the disclosure. Summing circuit 400C, which may function similar to summing circuit 400B, includes sense amp 410 coupled to bit line 405 (e.g., bit line 315-1 and/or bit line 315-2 in FIG. 3), a scaling amp 435 coupled to the output of sense amp 410, ADC 420 coupled to an output of scaling amp 435, and signal divider 430 coupled to the output of scaling amp 435 and bit line 405 (i.e., at the output of sense amp 410). In some embodiments, scaling amp 435 and signal divider may be part of a single unit or device (e.g., a "scaling unit"). In some embodiments sense amp may be a part of ADC. It should be appreciated that summing circuit 400C isolates bit line calculations (e.g., in a 2-stage analog pipeline). As such, there may be less disturbance to the bit line. Additionally, voltages may be allocated to different scales or ranges in a second stage. Accordingly, the impact of diminishing unit-LSB voltage value may be reduced. For example, the second stage may always be amplifying some portion of less significant part of fraction of accumulated voltage (mantissa) leaving the larger part (exponent) as computation moves to the next bits.

Figure 4D:
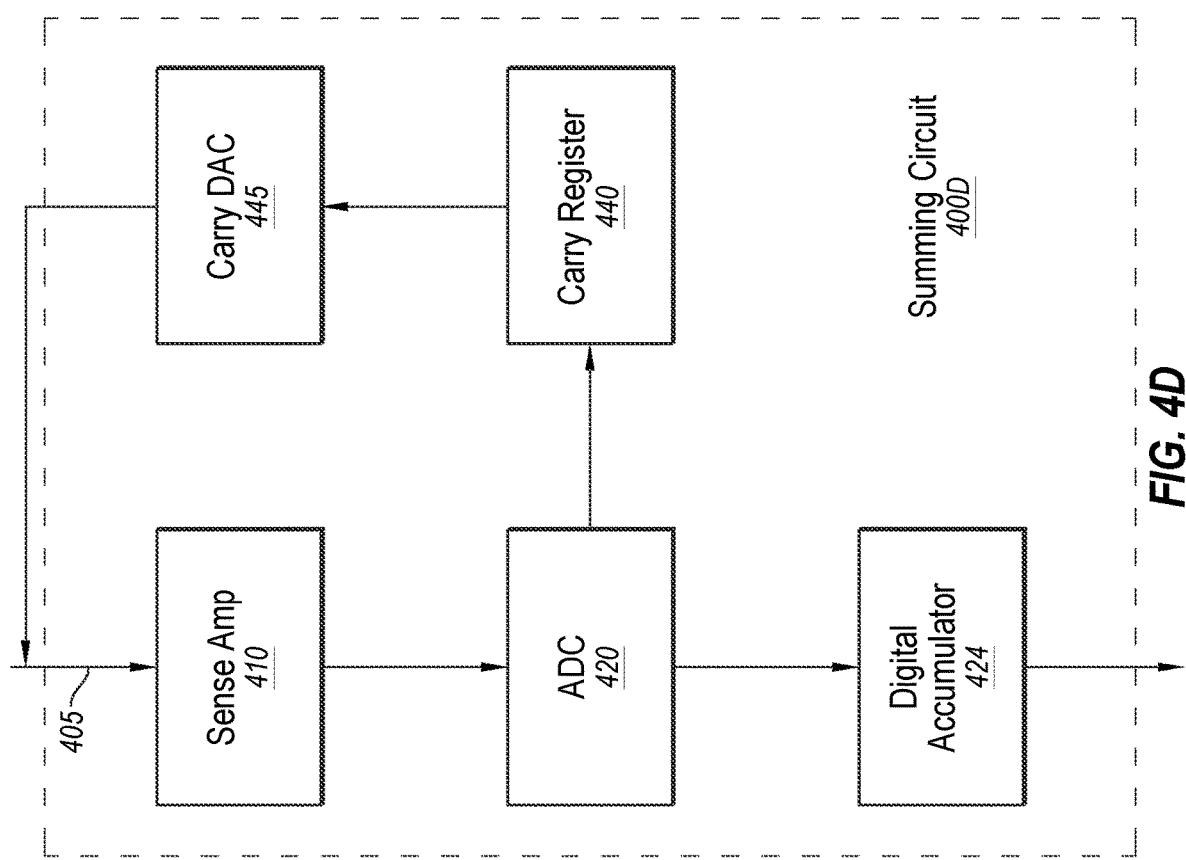
FIG. 4D illustrates another example summing circuit, in accordance with various embodiments of the present disclosure.

FIG. 4D illustrates another example summing circuit 400D, according to various embodiments of the disclosure. Summing circuit 400D includes sense amp 410 coupled to bit line 405 (e.g., bit line 315-1 and/or bit line 315-2 in FIG. 3), ADC 420 coupled to an output of sense amp 410, a carry register 440 coupled to the output of ADC 420, and a carry digital-to-analog converter (DAC) 445 coupled to carry register 440 and bit line 405 (alternative to coupling to bit line 405 the DAC 445 can be coupled to connection between sense amp and ADC). In some embodiments sense amp may be a part of ADC. Summing circuit 400D enables for "convert-as-you-go" functionality. That is, summing circuitry 400D enables convert-accumulate at every clock cycle.

Summing circuit 400D provides analog feedback to carry, similar to summing circuit 400B and 400C, which provide voltage division via signal divider 430. As will be described in further detail herein, summing circuit 400D feeds back the carry via carry register 440 and carry DAC 445. For example, (if weight, w(1,4)=1001 and x1=0101 (i.e., 5)) at CLK 1, bit 0, the initial carry to DAC 445, is 0000, and Vout of carry DAC 445 is 0V. As such, the voltage at bit line 405 is 0.0V (carry voltage)+2.25V (corresponding to x1[0])=2.25V. In this example, ADC 420 receives 2.25V from sense amp 410 and converts the voltage value to a binary value of 1001. Binary value 1001 is split and carried. In particular, carry register 440 receives a binary value of 100 from ADC 420, and digital accumulator 424 receives a binary value of 1 from ADC 420. This process may be repeated each clock cycle.

At CLK2, bit 1, the value of carry DAC 445, is 0100, which results in a Vout of carry DAC 445 of 1V. As such, the voltage at bit line 405 is 1.0V (carry voltage)+0.0V (corresponding to x1[1])=1.0V. In this example, ADC 420 receives 1.0V from sense amp 410 and converts the voltage value to a binary value of 0100. Binary value 0100 is split and carried. In particular, carry register 440 receives a binary value of 010 from ADC 420, and digital accumulator 424 receives a binary value of 0 from ADC 420.

At CLK3, bit 2, the value of carry DAC 445, is 0010, which results in a Vout of carry DAC 445 of 0.5V. As such, the voltage at bit line 405 is 0.5V (carry voltage)+2.25V (corresponding to x1[2])=2.75V. In this example, ADC 420 receives 2.75V from sense amp 410 and converts the voltage value to a binary value of 1011. Binary value 1011 is split and carried. In particular, carry register 440 receives a binary value of 101 from ADC 420, and digital accumulator 424 receives a binary value of 1 from ADC 420.

At CLK4, bit 3, the value of carry DAC 445, is 0101 which results in a Vout of carry DAC 445 of 1.25V. As such, the voltage at bit line 405 is 1.25V (carry voltage)+0.0V (corresponding to x1[3])=1.25V. In this example, ADC 420 receives 1.25V from sense amp 410 and converts the voltage value to a binary value of 0101. Digital accumulator 424 receives binary value 0101 since it is the last CLK cycle. As a result, digital accumulator 424 generates a binary value of 0101101, based on previously accumulated 101 (in CLK1, CLK2, CLK3) and lastly accumulated 0101 (in CLK4), which is 45 (i.e., the value of 9×5).

In some embodiments, summing circuit 400D is operated with quantization not below the LSB unit voltage value of 0.25V and within voltage rail of 4V. This option may require both digital-to-analog and analog-to-digital conversions. However, since some simple analog-to-digital conversions are based on DACs (e.g., successive approximation ADC), in some embodiments, one or more DACs may be integrated into summing circuit 400D to perform the above calculations without circuit expansion.

Figure 4E:
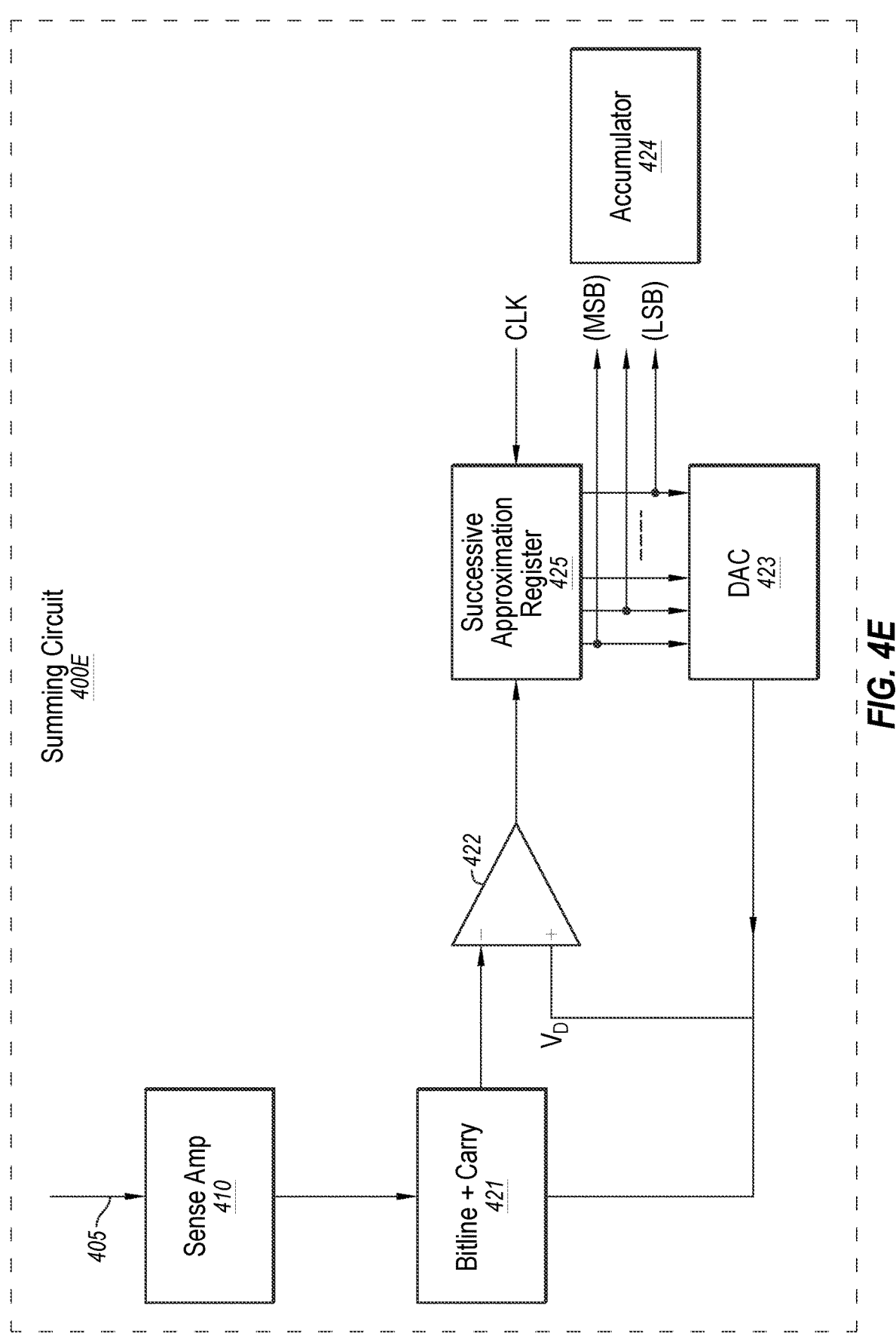
FIG. 4E illustrates yet another example summing circuit, in accordance with a number of embodiments of the present disclosure.

FIG. 4E illustrates yet another example summing circuit 400E, in accordance with various embodiments of the disclosure. Summing circuit 400E, which may allow for successive-approximation ADC, includes sense amp 410, a bit line+ carry circuit 421, a comparator 422, a successive approximation register (SAR) 425, a DAC 423 and an accumulator 424. Summing circuit 400E performs similar functionality as summing circuit 400D, as described above.

Referring to each of the summing circuits described herein, each primary clock (e.g., "big CLK") may have several ADC sub-clocks (e.g., 4 small clock cycles). Further, one DAC may serve two or more bit lines. As such, a primary clock may be started while conversion of the previous voltage occurs (e.g., overlap conversion and memory access). At the end of a conversion (e.g., after 4 sub-clocks) within a primary clock, a full digital value in the SAR (CLK 1: 1001) is generated.

With specific reference to FIG. 4E, in one example, a result of SAR 425 is 1001. This result is split, 100 is provided to DAC 423, and 1 is provided to accumulator 424 as bit 0. An output of 100 from DAC 423 is converted and received into bit line+ carry circuit 421 where it is held and added to an analog value of sense amp 410 from the next primary CLK. The resulting value is then fed into comparator 422, and SAR 425 starts a new conversion cycle (4 sub-clocks). The process may repeat until the last primary CLK. During or after the last primary CLK, the full result from SAR 425 is stitched to accumulator 424 as the MSBs.

In the examples described above including summing circuits, a single multiplication is calculated. However, referring to at least equations 1, 2 and 3 (above), voltage summation is commutative and associative. In various embodiments, the summing circuits may also process the addition of multiple products in a single operation on a single bit line for each neuron. Thus, multiple signals x_k (e.g., signals x1, x2, x3 and so on) may drive separate word lines at the same time. Starting from LSB to MSB, the x_k signals may drive respective word lines in synchrony yielding a partial product with each clock cycle. In at least one embodiment, an ADC-enabled sense amplifier may accumulate these partial products and produce the dot product.

Referring to at least Equation 2 (above) and the previous example referring to at least summing circuit 400D, suppose weight w(2,4)=0111 (i.e., decimal 7 or translated to voltage it is 1.75V), weight w(3,4)=1010 (i.e., decimal 10 or translated to voltage it is 2.50V), and x2=1110 (i.e., 14) and x3=0011 (i.e., 3), the desired dot product is (5×9)+(14×7)+(3×10)=45+98+30=173.

At CLK 1, bit 0, the initial value of carry DAC 445, is 0000, which results in a Vout of carry DAC 445 of 0.0V. As such, the voltage at bit line 405 is 0.0V (carry voltage)+ 2.25V (for x1[0])+0.00V (X_2[0])+2.50V (X_3[0])=4.75V. In this example, ADC 420 receives 4.75V from sense amp 410 and converts the voltage value to a binary value of 10011. Binary value 10011 is split and carried. In particular, carry register 440 receives a binary value of 1001, and digital accumulator 424 receives a binary value of 1.

At CLK 2, bit 1, the value of carry DAC 445, is 1001 which results in a Vout of carry DAC 445 of 2.5V. As such, the voltage at bit line 405 is 2.25V (carry)+0.00V (X_1[1])+ 1.75V (X_2[1])+2.50V (X_3[1])=6.5V. In this example, ADC 420 receives 6.5V from sense amp 410 and converts the voltage value to a binary value of 11010. Binary value 11010 is split and carried. In particular, carry register 440 receives a binary value of 1101, and digital accumulator 424 receives a binary value of 0.

At CLK 3, bit 2, the value of carry DAC 445, is 1101 which results in a Vout of carry DAC 445 of 3.25V. As such, the voltage at bit line 405 is 3.25V (carry)+2.25V (X_1[2]) +1.75V (X_2[2])+0.00V (X_3[2])=7.25V. In this example, ADC 420 receives 7.25V from sense amp 410 and converts the voltage value to a binary value of 11101. Binary value 11101 is split and carried. In particular, carry register 440 receives a binary value of 1110, and digital accumulator 424 receives a binary value of 1.

At CLK 4, bit 3, the value of carry DAC 445, is 1110 which results in a Vout of carry DAC 445 of 3.5V. As such, the voltage at bit line 405 is 3.50V (carry)+0.00V (X_1[3])+ 1.75V (X_2[3])+0.00V (X_3[3])=5.25V. In this example, ADC 420 receives 5.25V from sense amp 410 and converts the voltage value to a binary value of 10101. Digital accumulator 424 receives a binary value of 10101 (no splitting and carry in this CLK since this is a last bit and last CLK) and generates a binary value of 1011101 by concatenated the last value '10101' with previously accumulated bits. The binary value 1011101 is decimal 173 (i.e., (5×9)+ (14×7)+(3×10)).

In the above example, the output voltage increases over the rail of 4V. Practically, this may not be ideal because an amplifier saturates at the rail. In general, every $2^N$ additional summands in the dot product may require N additional bits. For example, 128 summands require at least 7 bits to the base of 4 bits=11 bits or 0-2048 range. If the same LSB unit of 0.25V is used, then 0-512V range may be needed (which may not be practical). This also does not consider the carry, which adds another bit (carry may be as large as N bits). This issue may be resolved in various ways. For example, LSB units may be reduced such that an amplifier stays within the rail. For example, for 11 bits, the LSB unit is $4V/2^{11}$=~1.9 mV, and for 32 bits, the LSB is $4V/2^{32}$=~0.9 nV.

In some examples, the computation may be serialized. The degree of serialization can be a configurable parameter. It can be further provided to the user of the system to achieve desired tradeoff of precision vs speed. If a user can tolerate low precision the method simply resolves the dot product without serialization to the best accuracy that ADC can provide (ADC accuracy is limited to the unit LSB). In another embodiment, the carry may not be fed back into the bit line (e.g., (1) the carry is kept digital or (2) the carry bit is kept analog and scaled and subsequently added to the dot product with every clock cycle internally within the converter (e.g., ADC converter) after summation on bit line). In another example, the number of voltage levels are reduced within each clock. This is another form of serialization. For a 4-bit number with two voltage levels, a dot product may be computed in eight clock cycles (two sub-cycles within each cycle: first sub-cycle handling bits 0 and 1 and second sub-cycle handling bits 2 and 3). In addition, such serialization allows weight allocation in a rectangular format (X and Y in memory array, i.e., a weight is allocated along more than one bit line and the same set of word lines). In addition, it is possible to reduce voltage levels down to a single voltage level (binary). Combination of two or more of the above techniques is of course possible.

As a result of the operations described above, an output of a neuron associated with amplifier 351 (see FIG. 3) may be generated. In some embodiments, this output may be further fed into a non-linear function, which may be implemented as a part of summing circuit 350. As noted above, an output of a neuron in a layer is a dot product of weight vectors (e.g., synaptic weights of a neuron) and input vectors (e.g., input signals to a neuron) from previous layers (as provided by the Equation 1) and more specifically related to the above example (as provided by Equation 2).

Similar to output of a neuron associated with amplifier 351, an output of a neuron associated with amplifier 352 may be generated (as provided by Equation 3) (e.g., concurrently generated with the output of a neuron associated with amplifier 351). Output of other neurons associated with other amplifiers not shown in FIG. 3 may be generated in a similar way. Thus, the output of a whole neural network layer associated with memory array 300 may be generated. This output, which may serve as an input to other layers of a neural network, may be generated as a part of inference operation. The inference operation may be a part of ANN, DNN, CNN, LSTM and alike neural networks that use artificial neurons computing outputs via a dot product operation.

In addition to an inference operation, the same methodology can be used for error back propagation (training) operation, which is also based on dot product. However, in contrast to an inference operation that computes outputs of neurons where weights are grouped by neuron, for error back propagation operation (i.e., that computes a scaled error based on other errors), the weights in the dot product are grouped by common input connection of a group of input connections (e.g., the group of input connections from the inference operation). Thus, the weights may belong to different neurons but are associated with the same input connection (i.e., the transpose of the weight matrix of the array 300, where the same weights are allocated in a transposed manner in a different array relative to the array 300).

Further, the error output of error back propagation operation from a layer of a neural network may serve an error input to other layers of the neural network (e.g., for computing their error back propagation operation). This error output may be generated as a part of a training operation. The training operation may be a part of ANN, DNN, CNN, LSTM and alike neural networks that use artificial neurons computing their error outputs with a use of a dot product operation. Both inference and training may be computed in memory device(s) if such memory devices keep the weights of layers and a transposed weights of layers. Each copy of a weight in both normal and transposed allocations may need to be modified after each training cycle.

Figure 5:
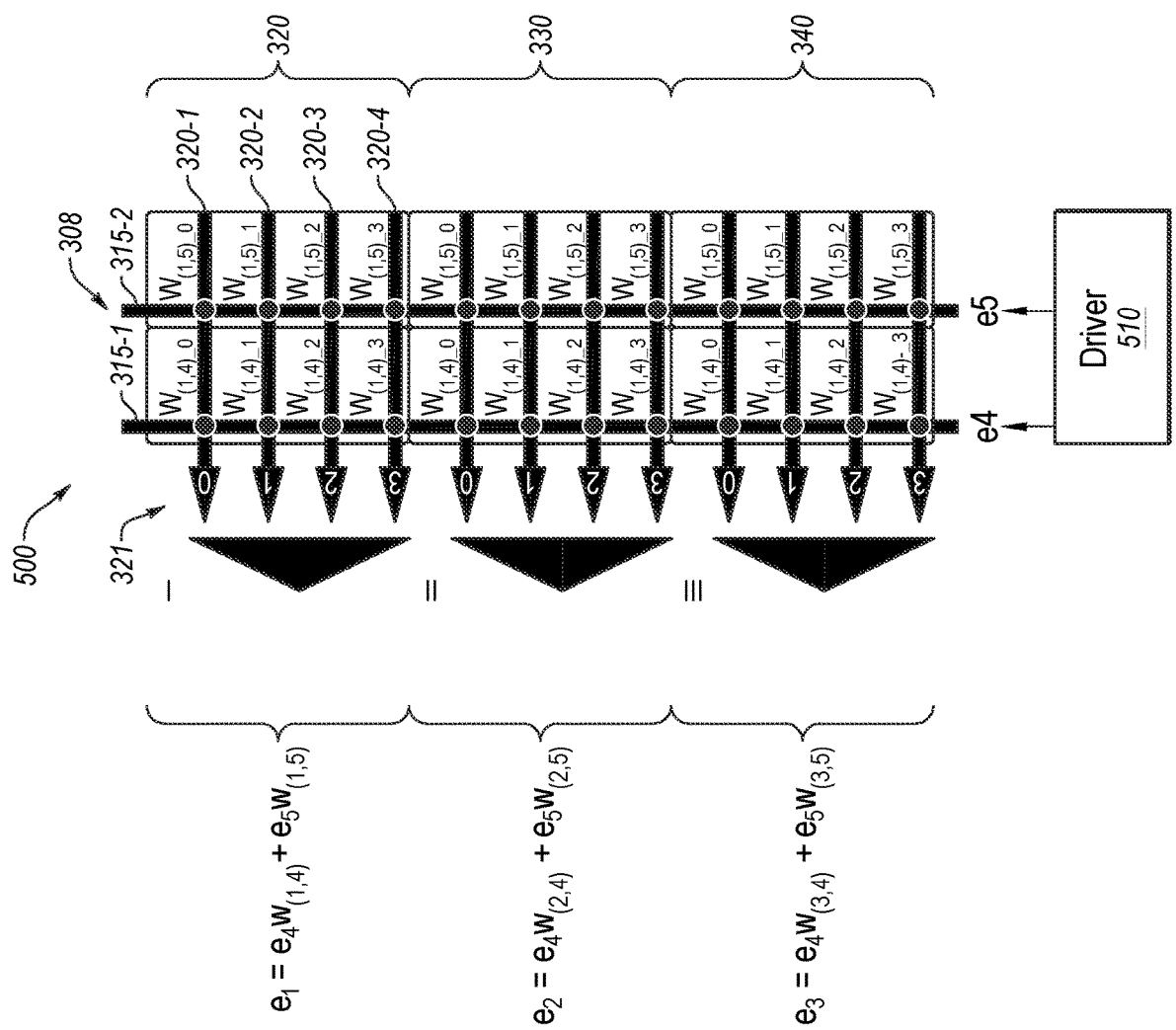
FIG. 5 illustrates another example device for performing one or more operations, in accordance with a number of embodiments of the present disclosure.

FIG. 5 depicts an embodiment of a device 500, according to various embodiments of the disclosure. Device 500 may be configured for performing PIM operations, such as performing a dot product of weight vectors (e.g., synaptic weight) and error vectors of layers in an ANN (e.g., for a backward pass). Further, for example, a dot product of weight vectors and error vectors may be computed (e.g., in parallel) on a group of word lines for each input error vector. This alternative computation of the error back propagation may not require a transposed copy of the weight array.

In various embodiments, the techniques described for forward pass (inference), such as the techniques described with respect to at least FIGS. 3-4E, may also be used for backward propagation with a small variation. The small variation may be that the weight matrix is transposed. Regarding forward propagation, Y=F(x·w) (equation 1) is implemented. However, for error back propagation, the following equation is implemented:

$$E_{i-1}=E_i \cdot W_i;$$  (Equation 4)

wherein i is the layer number.

Instead of transposing a weight matrix back and forth, two copies of the weight matrix are used: W and W', where W is used for forward propagation and W' is used for backward propagation. It is noted that both W and W' may be updated after each training cycle/epoch. Thus, the algorithm provided for inference is symmetric. That is, it may be used for both types of computations.

Referring again to FIG. 2, the error back propagation for layer 210, that includes Node 1, Node 2 and Node 3, is the dot product of $e_1$ (associated with Node 1), the dot product of $e_2$ (associated with Node 2) and the dot product of $e_3$ (associated with Node 3), where $e_1=(e_4W_{(1,4)}+e_5w_{(1,5)})$, $e_2=(e_4w_{(2,4)}+e_5w_{(2,5)})$, and $e_3=(e_4w_{(3,4)}+e_5w_{(3,5)})$.

In various embodiments, for symmetric memory arrays (e.g., cross-point memory arrays), input and output may be applied symmetrically to/from both word lines and bit lines. Thus, for error back propagation, error input may be applied to bit lines and error output may be computed from the word lines.

In some embodiments, for error back propagation, the number of voltage levels is one (instead of four voltage levels for forward propagation). This serializes compute on a bit line within each input bit. Further, in some embodiments, the weights are allocated on the word line regions such that error inputs come from bit lines. For example, driver 510 (see FIG. 5) drives e4 on bit line 315-1 and drives e5 on bit line 315-2. This provides a return parallelism within computing each input bit. Thus, serially, bit by bit, error input is provided on the bit lines.

In various embodiments, each sense amp in a group may count a number of bits with value '1' using a mixed-signal approach described above. For example, a group of sense amps 321 includes sense amp 0 coupled to word line 320-1, sense amp 1 coupled to word line 320-2, sense amp 2 coupled to word line 320-3, and sense amp 3 coupled to word line 320-4. It should be appreciated that any approach described herein with respect to forward pass may be suitable.

In some embodiments, voltages, sensed by the sense amps, are shift-accumulated either before or after conversion. Thus, for example, in a number of clocks (e.g., four clocks), the whole error layer is back-propagated. Moreover, the performance of back propagation is independent of the number of columns and rows (to the degree of voltage resolution).

Figure 6:
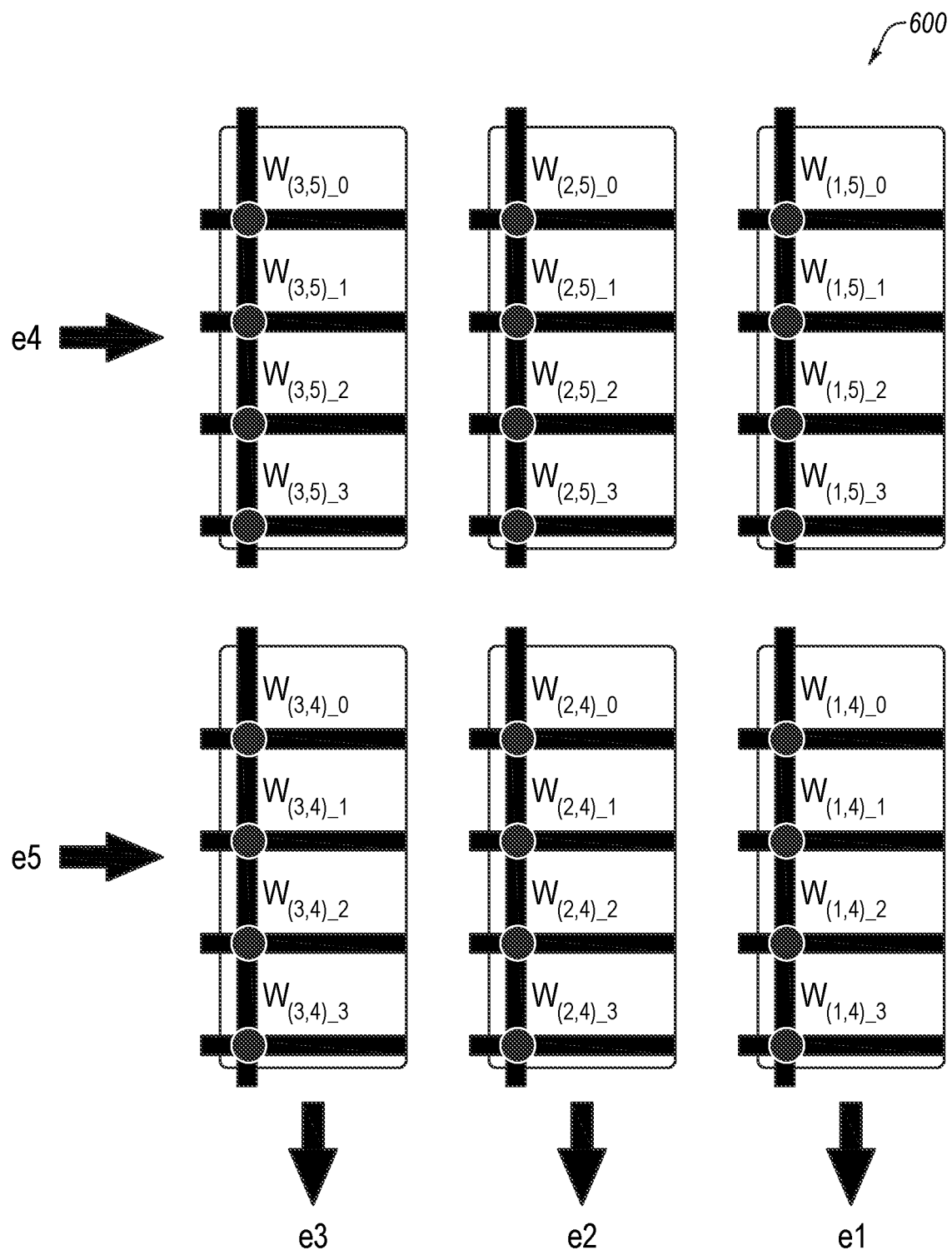
FIG. 6 illustrates yet another example device for performing one or more operations, in accordance with a number of embodiments of the present disclosure.

FIG. 6 depicts an example device 600, according to various embodiments of the disclosure. Device 600 may be configured for performing PIM operations such as performing a dot product of weight vectors (e.g., synaptic weight) and error vectors (e.g., of layers in an ANN). In at least this embodiment, the weight matrices are stored on three bit lines rather than two bit lines (e.g., as in device 500 of FIG. 5). In some embodiments, a driver (not shown) drives e4 and e5 on respective groups of word lines. As a result, voltages, sensed by sense amps coupled to the respective bit lines (not shown) are shift-accumulated either before or after conversion. As such, the error layer is back propagated.

Figure 7:
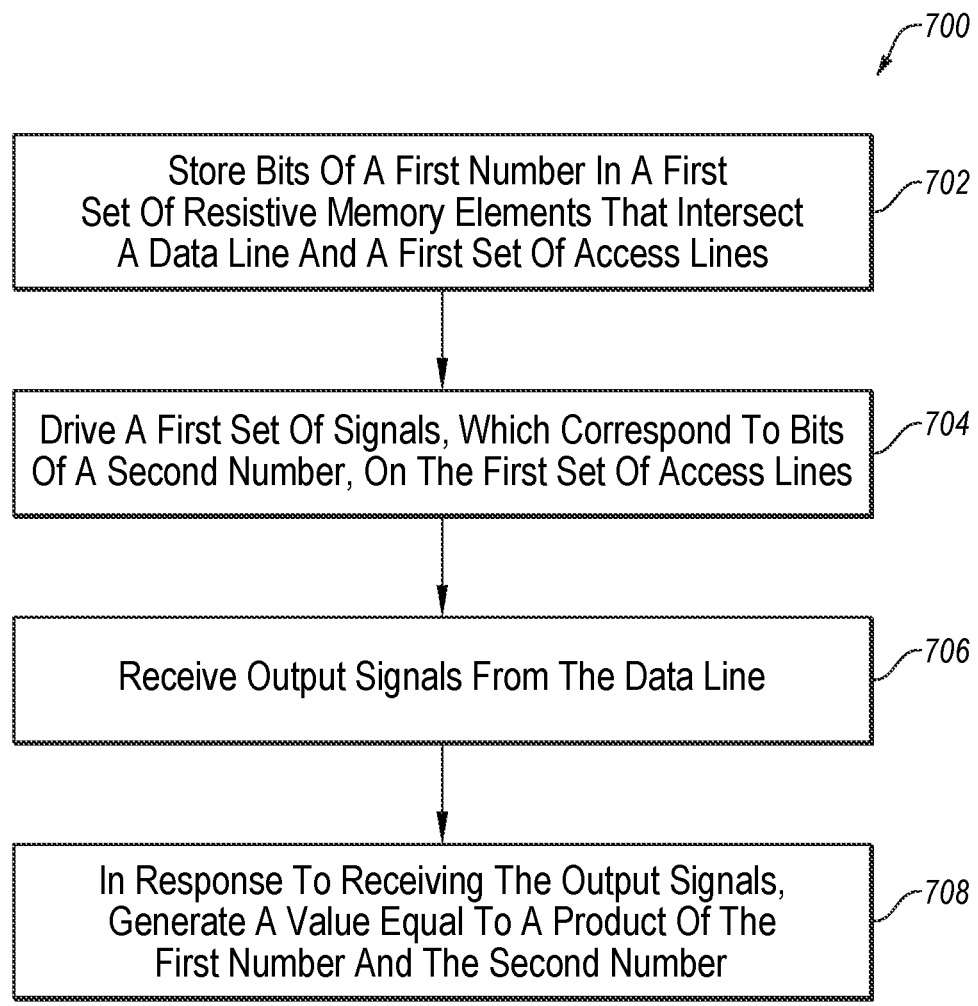
FIG. 7 is a flowchart of an example method of operating a memory device, in accordance with various embodiments of the present disclosure.

FIG. 7 is a flowchart of an example method 700 of operating a memory device, in accordance with various embodiments of the disclosure. Method 700 may be arranged in accordance with at least one embodiment described in the present disclosure. Method 700 may be performed, in some embodiments, by a device or system, such as system 100 of FIG. 1, device 300 of FIG. 3, circuits 400A, 400B, 400C, 400D, and/or 400E of FIGS. 4A-4E, device 500 of FIG. 5, device 600 of FIG. 6, memory system 900 of FIG. 9, and/or electronic system 1000 of FIG. 10, or another device or system. Although illustrated as discrete blocks, various blocks may be divided into additional blocks, combined into fewer blocks, or eliminated, depending on the desired implementation.

Method 700 may begin at block 702, where a first number of bits may be stored in a first set of memory elements (e.g., resistive memory elements) that intersect a data line and a first set of access lines, and method 700 may proceed to block 704. For example, bits may be stored on memory cells at the intersections of bit lines (data lines) 315 and word lines (access lines) 320, 330, and 340 (see e.g., FIG. 3).

At block 704, a first set of signals that correspond to bits of a second number may be driven on the first set of access lines, and method 700 may proceed to block 706. For example, driver 305 (see FIG. 3) may drive signals (e.g., voltage or current signals) on word lines (access lines) 320, 330, and 340 (see e.g., FIG. 3).

At block 706, one or more output signals from the data line may be received, and method 700 may proceed to block 708. For example, the one or more output signals may be received at a summing circuit (e.g., summing circuit 400A of FIG. 4A, summing circuit 400B of FIG. 4B, summing circuit 400C of FIG. 4C, summing circuit 400D of FIG. 4D, or summing circuit 400E of FIG. 4E).

At block 708, in response to receipt of the output signals, a value equal to a product of the first number and the second number may be generated. More specifically, for example, the summing circuit may determine the product of first number and the second number.

Modifications, additions, or omissions may be made to method 700 without departing from the scope of the present disclosure. For example, the operations of method 700 may be implemented in differing order. Furthermore, the outlined operations and actions are only provided as examples, and some of the operations and actions may be optional, combined into fewer operations and actions, or expanded into additional operations and actions without detracting from the essence of the disclosed embodiments.

Various embodiments, as disclosed herein, use voltage/current DC coding. However, the present disclosure is not so limited and other types of coding may be used. For example, AC codes may be used, such as frequency, frequency+ amplitude, frequency phase shifts, waveforms of various formats (e.g., steps, pulses, PWM, spikes, saw-tooth etc.), with and without amplifiers, with a single resistor or capacitor at the end of bit line, with pulsed current and accumulated charge at the capacitance of bit line, and others.

In embodiments utilizing frequency coding, a simple integrator (e.g., op amp integrator or sense amp integrator) may be used (e.g., an integrator and low-pass filter at the same time). In these embodiments, the LSB of an input may correspond to the highest frequency (most attenuated) and MSB may correspond to the lowest frequency (least attenuated). Further, an RC circuit may be adjusted to tune the corner frequency and place input frequency codes such that their integration results would be power of 2 apart. Frequency-coded design may be more robust to noise and less susceptible to precision variations. For example, a frequency could be sinusoidal, pulse-width, or another AC form.

In some capacitive memory architectures, such as HRAM and DRAM, charge sharing may occur during memory cell read out. In some embodiments, charge sharing may be used with multiple cells such that an accumulated charge is a function of number of set bits, and therefore, the accumulated charge may be used to compute a dot product. For example, a position of the bit may be correlated to amplification of a voltage value received as an outcome of charge sharing. Amplification may be performed in an analog or digital domain, and number allocation may be performed in a bit-serial or bit-parallel manner. A destructive read may necessitate a need to keep a copy of the data and a mechanism to restore the data. Further, with HRAM, it may be possible to do partial charge-sharing such that a partial charge remains in the cell and is immediately reinforced after read out. This may require HRAM to have larger cell capacitance.

In some embodiments, if a weight can be represented with full dynamic range of a resistor (instead of just binary LRS and HRS, On or Off), and an input can be represented with full dynamic range of the voltage, and each weight may be represented by a single memory cell, and each input may be represented by a single voltage. In this case, a dot product may be performed in a single clock cycle. Anything in between pure analog and pure binary is possible. For example, if a memory cell resistance has 4 recognizable stages, each weight may be coded with two cells and still yield 4-bit representation. As another example, if a memory cell resistor is pure analog and an input is digital, one cell per weight may be used and a dot product may be computed in the number of clock cycles representing the input. Other options between pure analog and pure binary are possible.

Cell-to-cell variations in terms of current injection into a bit line may be a challenge. If unit current varies, the resulting dot product may be skewed. To increase the precision, multiple memory cells per bit may be allocated (i.e., trading off capacity for accuracy because more cells per bit may increase accuracy).

As will be appreciated, ADCs are expensive (i.e., in area and processing). A Flash ADC includes a string of resistors and comparators that provide reference for thermometric coding. In some embodiments, it may be possible to configure part of memory array to be a Flash ADC. Flash ADCs are very fast, hence a single ADC could cover many operations per clock.

It is noted that the computing schemes described herein (e.g., forward and backward propagation) are symmetric and interchangeable, and thus forward propagation may be used for training, and backward propagation may be used for inference (i.e., depending on how the weight matrix is allocated). For example, forward propagation may be calculated with four voltage levels or a single voltage level. Further, backward propagation may be calculated with four voltage levels or a single voltage level.

As noted above, in some embodiments, computation may be serialized. A disadvantage of serialization is that each row has to be loaded into an FMA array, masked by a current error bit on each bit line, and the total count of such bits is then shift-accumulated by a sequencer. An advantage of serialization is reliability and adoptability for some technologies, like NAND. In fact any multiplication (e.g., float or integer) may be done via a bit count and knowledge of whether the bit count is even or odd.

In other embodiments, a bit-parallel dot product operation may be performed via bit-parallel FMA units, such as described U.S. patent application Ser. No. 16/841,222, titled "METHODS FOR PERFORMING PROCESSING-IN-MEMORY OPERATIONS, AND RELATED MEMORY DEVICES AND SYSTEMS," filed Apr. 6, 2020. In these embodiments, performance may scale with columns (i.e., more columns and more clock cycles to compute) (i.e., in contrast to serialization, which scales infinitely). In yet other embodiments, bit-serial dot product operations may be performed via bit lines and FMA, such as described in U.S. patent application Ser. No. 16/717,890, titled "METHODS FOR PERFORMING PROCESSING-IN-MEMORY OPERATIONS ON SERIALLY ALLOCATED DATA, AND RELATED MEMORY DEVICES AND SYSTEMS," filed Dec. 17, 2019. In these embodiments, performance scales with rows (e.g., more rows and more clock cycles to compute). (i.e., in contrast to serialization, which scales infinitely). In bit-serial, a unique operand may be used for each column (i.e., bit line) (e.g., to compute error * weight), and a dot product may be computed based on unique numbers. For example, with reference to FIG. 8, which depicts a number of bit lines BL and a number of word lines WL, a contemplated operation will now be described.

Numbers from a vector A are co-allocated with numbers from a vector B, and numbers from a vector C are co-allocated with numbers from a vector D. A pair of sense amplifier (SAs) coupled together with a 1-bit communication link may compute a dot product. More specifically, sense amplifiers SA0 and SA1 may compute A×B, and sense amplifiers SA2 and SA3 may compute C×D. Similar to other embodiments disclosed above, a sequencer 802 may control the FMA (i.e., a row of sense amplifiers SAs). However, in this embodiment, sequencer 802 may send a sequence of 1 s, thus dictating to compute XOR-carry for each bit position. At the same time, one of the two vectors in each pair (e.g., vector A in dot product A×B, and vector C in dot product C×D) may play a role of predication mask. That is, for each bit value 0 in each predication mask, the pair of sense amplifiers may skip XOR-carry, and for each bit value 1, the pair of sense amplifiers may compute XOR-carry. As a result, even with global sequence (e.g., just a clock) with predication, dot products may be computed via unique numbers.

Figure 8:
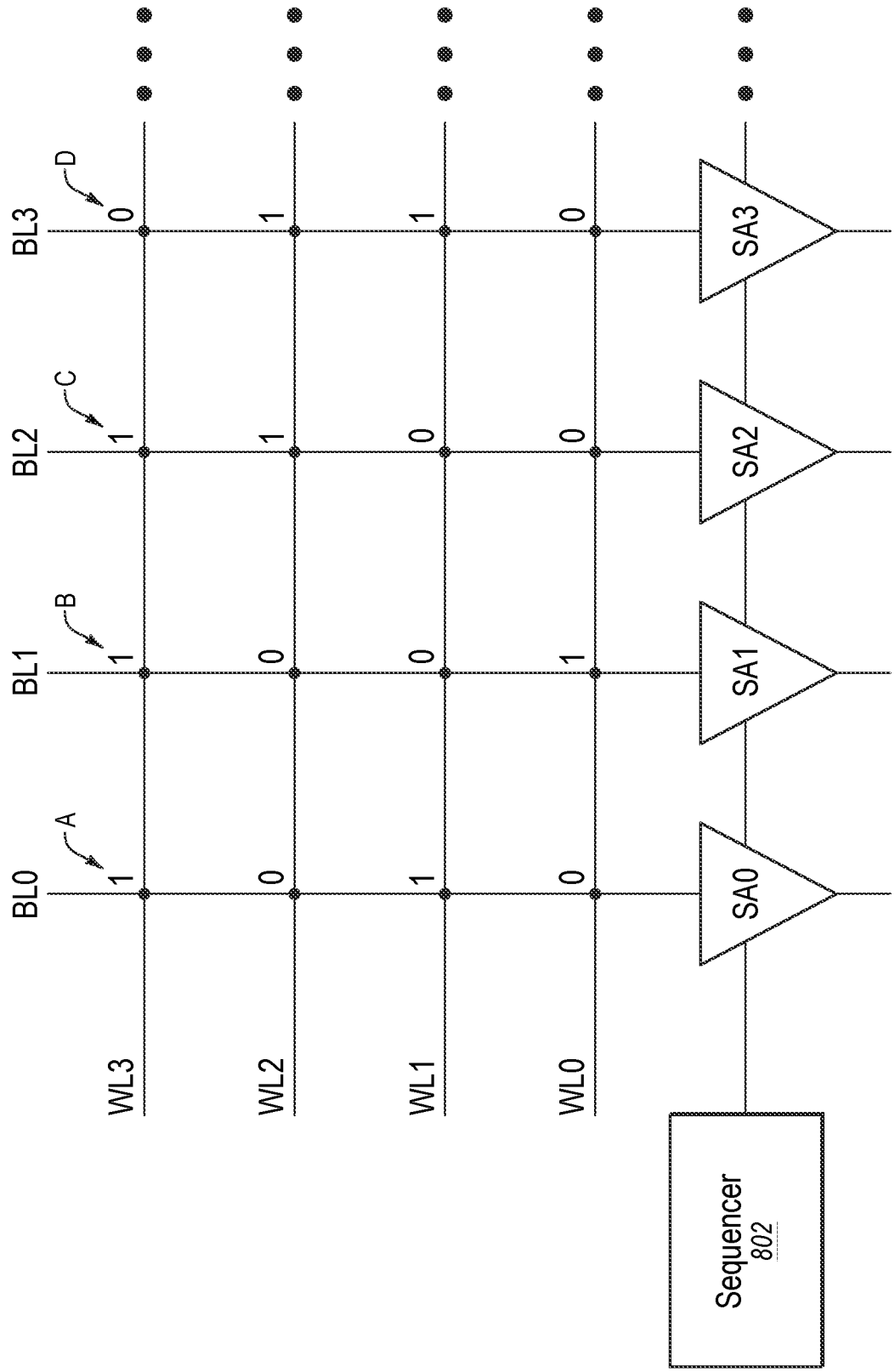
FIG. 8 depicts a number of bit lines and a number of word lines.

Alternative co-allocation can be done when a planar memory array is split into halves, such as matrix A in first half and matrix B in second half (e.g., numbers A and C in one half and numbers B and D in another). Also, with 3D technology, more co-allocation variants are possible. Further, a predication mask may be delivered to sense amplifiers from an external source in the form of row (e.g., a row of 1st bits for all numbers of vectors A, B, C, D, then a row of 2nd bits for all numbers of vectors A, B, C, D, etc.). It is noted that a bit-parallel option is similar, except the numbers are allocated horizontally instead of vertically, as shown in FIG. 8. Further, the result of A×B may be summed with the result of C×D (e.g., via connecting the sense amplifiers and computing in log time).

Further, in some embodiments, after computing errors at a current layer, error copies may be forwarded to the layer below (e.g., to perform back propagation at that layer). Then, at the current layer, the weights are simply adjusted according to a rule: weight_new=weight_old+ error× learning_rate× input. In some embodiments, "in-place" update may occur wherein all weights are updated (e.g., at one time)

in place where the weights are stored. An update may occur either A) serially column-wise and parallel row-wise; or B) serially row-wise and parallel column-wise.

For serially column-wise and parallel row-wise, weights may be extracted a column at the time in a bit-parallel manner and a new weight on a sense amplifier array may be computed that drives-senses word lines. In this embodiments, inputs are unique to each row (i.e., a group of rows), an error is common for a column, and a learning rate is global. Thus, a bit-parallel operation, such as described in U.S. patent application Ser. No. 16/841,222, may be used. Hence, an 'error× learning_rate' for a column may be computed, and the error x learning_rate may become a common multiplier to command a sequencer. Inputs are then loaded into an FMA array and multiplied by the common multiplier. Further, a column of weights may be loaded and addition may be performed. This process may repeat for the next column of weights.

For serially row-wise and parallel column-wise, weights may be extracted row-wise in bit-serial manner and a new weight on a sense amplifier array may be computed that drives-senses digit lines. Similar to embodiment described above, inputs are unique to each row (i.e., a group of rows), an error is common for a column, and a learning rate is global. Thus, a bit-serial operation, such as described in U.S. patent application Ser. No. 16/717,890, may be used. Hence, 'input×learning_rate' for a group of rows may be computed, and input×learning_rate may become a common multiplier to command a sequencer. Errors are then bit-serially loaded into an FMA array and multiplied by the common multiplier. Further, a row of weights may be bit-serially loaded, and addition may be performed. The process may repeat for the next group of rows representing weights.

Figure 9:
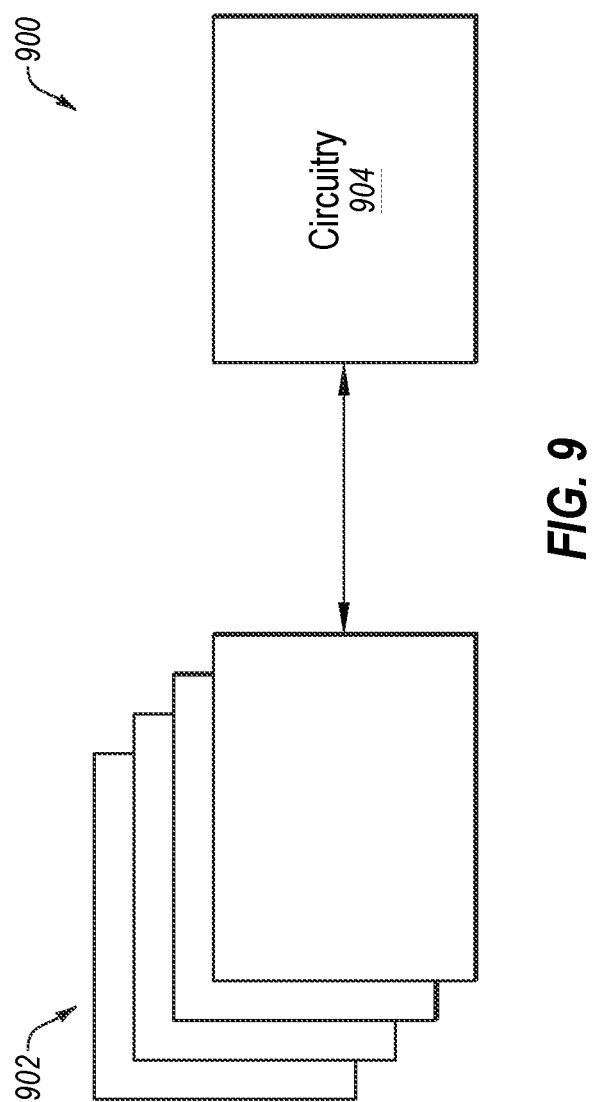
FIG. 9 is a simplified block diagram of an example memory system, according to one or more embodiments described herein.

A memory system is also disclosed. According to various embodiments, the memory system may include a memory device (e.g., memory device 120 of FIG. 1) including one or more memory cell arrays. FIG. 9 is a simplified block diagram of a memory system 900 implemented according to one or more embodiments described herein. Memory system 900, which may include, for example, a semiconductor device, includes a memory array 902 and circuitry 904, which may include, for example only, one or more summing circuits and/or one or more drivers, as described herein. Memory array 902, which may include a number of memory banks, may include a number of memory cells. For example, memory array 902 may include memory array 308 (see FIGS. 3 and 5). Circuitry 904, may be operatively coupled with memory array 902, may be configured for carrying out one or more embodiments disclosed herein.

Figure 10:
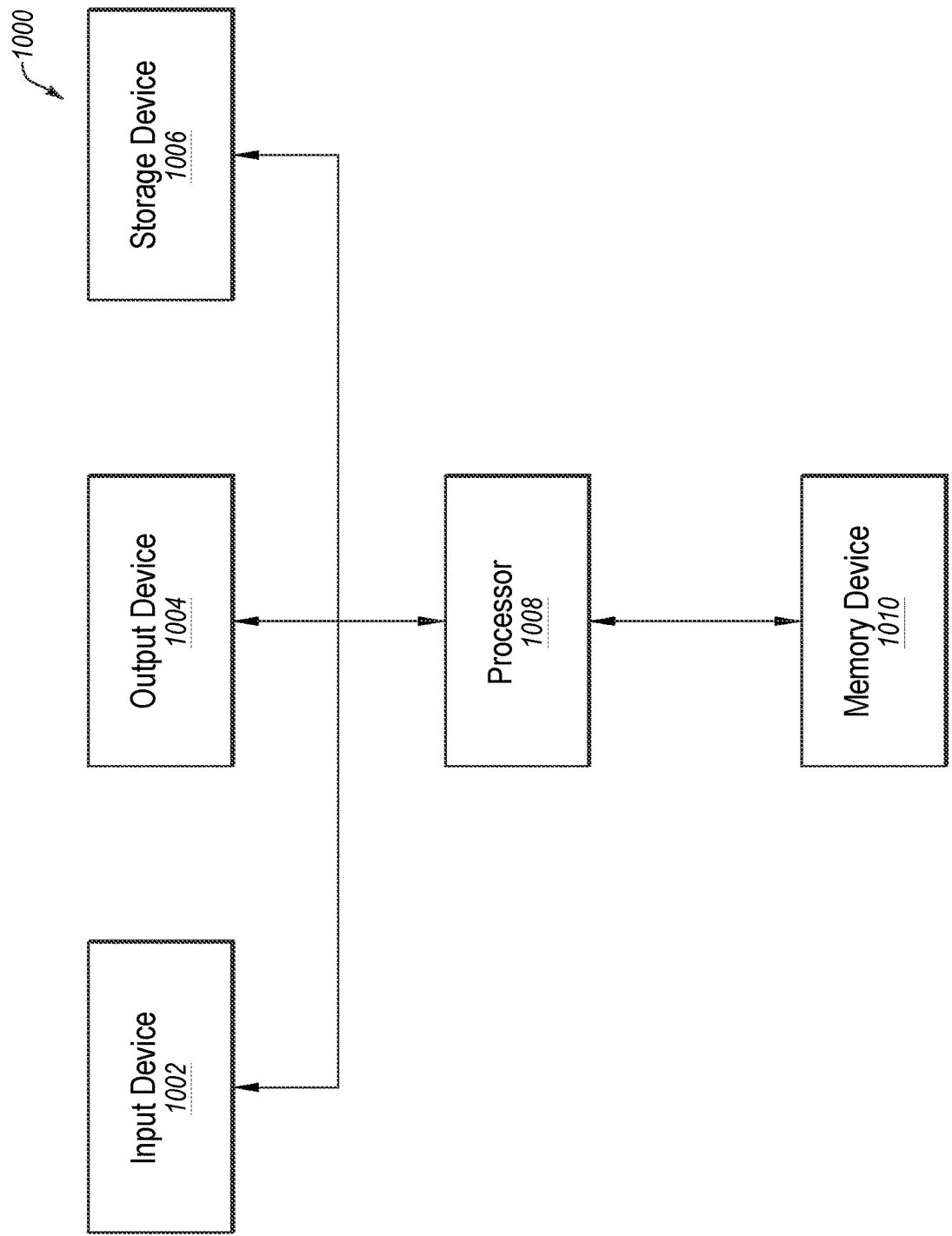
FIG. 10 is a simplified block diagram of an example electronic system, according to one or more embodiments described herein.

An electronic system is also disclosed. The electronic system may include memory system including a number of memory devices. FIG. 10 is a simplified block diagram of an electronic system 1000 implemented according to one or more embodiments described herein. Electronic system 1000 includes at least one input device 1002, which may include, for example, a keyboard, a mouse, or a touch screen. Electronic system 1000 further includes at least one output device 1004, such as a monitor, a touch screen, or a speaker. Input device 1002 and output device 1004 are not necessarily separable from one another. Electronic system 1000 further includes a storage device 1006. Input device 1002, output device 1004, and storage device 1006 may be coupled to a processor 1008. Electronic system 1000 further includes a memory device 1010 coupled to processor 1008. Memory device 1010, which may include memory system 900 of FIG. 9, may include an array of memory cells. Electronic system 1000 may include, for example, a computing, processing, industrial, or consumer product. For example, without limitation, system 1000 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

According to various embodiments disclosed herein, and in contrast to some conventional devices, systems, and methods, data used in one or more PIM computations may be used to perform, for example, forward propagation and backward propagation (e.g., in a ANN). As a result, a number of reads from and/or writes to one or more memory arrays may be reduced, which may improve efficiency and/or speed of PIM operations and/or reduce latency associated with PIM operations. One or more embodiments of the present disclosure include a memory device. For example, a memory device may include a memory array that includes a bit line, a first set of word lines intersecting the bit line, a first set of memory elements at the intersection of the bit line and the first set of word lines, wherein a first number is stored at least in part in the first set of memory elements. The memory device may include a driver configured to drive a first set of signals on the first set of word lines, wherein the first set of signals correspond to bits of a second number, and respective values of the first set of signals may or may not be different from one another. The memory device may also include a summing circuit configured to receive output signals from the bit line, and in response to receiving the output signals from the first bit line, generate a value equal to a product of the first number and the second number.

According to another embodiment, a method includes storing a first number at least in part in a first set of memory elements that intersect a data line and a first set of access lines. The method may also include driving a first set of signals, which correspond to bits of a second number, on the first set of access lines, wherein respective values of the first set of signals may or may not be different from one another. The method may further include receiving output signals from the bit line, and in response to receiving the output signals, generating a value equal to a product of the first number and the second number.

According to another embodiment, a system comprises a memory array. The memory array may include a bit line and a first set of word lines. A first weight vector between a first node and a second node in a neural network may be stored at least in part at respective intersections between the bit line and the first set of word lines, wherein the first node is in a first layer of a neural network, and the second node is in a second layer of the neural network. The system may include a driver configured to drive signals on the first set of word lines, wherein the signals correspond to bits corresponding to a first input vector between the first node and the second node. The system may include a summing circuit configured to receive signals from the bit line, and in response to receiving the signals from the first bit line, generate a value equal to a product of the first weight vector and the first input vector.

Additional embodiments of the present disclosure include an electronic system. The electronic system may include at least one input device, at least one output device, and at least one processor device operably coupled to the input device and the output device. The electronic system may also include at least one memory device operably coupled to the at least one processor device and including a memory array.

The memory array may include a bit line, a number of word lines intersecting the bit line, and a number of memory elements. Each intersection of the bit line and the number of word lines includes a memory element of the number of memory elements. Further, bits of a first number may be stored at least in part in the first set of memory elements. The memory device may further include a driver configured to drive a first set of signals on the number of word lines, wherein the first set of signals corresponds to bits of a second number.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC). In some embodiments, the computation methods described herein may be applicable to storage device, such as solid-state drives. Therefore, the term "memory device" used herein may be include a storage device.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. An apparatus, comprising:
a bit line coupled to a plurality of memory elements of a memory array;
a first set of word lines intersecting the bit line;
a first set of memory elements of the plurality at intersections of the bit line and the first set of word lines, the first set of memory elements configured to store ordered bits of a first number; and
a driver configured to drive a first set of signals on the first set of word lines, the first set of signals corresponding to ordered bits of a second number.

2. The apparatus of claim 1, further comprising a second set of memory elements at intersections of the bit line and a second set of word lines;
wherein bits of a third number are stored in the second set of memory elements; and
wherein the driver is further configured to drive a second set of signals on the second set of word lines intersecting the bit line, wherein the second set of signals correspond to bits of a fourth number.

3. The apparatus of claim 1, further comprising a summing circuit configured to:
receive a number of output signals from the bit line;
generate a digital output in response to receipt of an output signal of the number of output signals;
shift the digital output; and accumulate the shifted digital output to generate a first value equal to the product of the first number and the second number.

4. The apparatus of claim 3, wherein the summing circuit comprises:
a scaling unit configured to:
receive a first output signal of the number of output signals of the bit line;
provide a second signal that is a fraction of the first output signal; and
integrate the second signal with a second output signal of the number of output signals of the bit line.

5. The apparatus of claim 3, wherein the summing circuit comprises:
a sense amplifier having an input coupled to the bit line;
a scaling amplifier having at least one input coupled to an output of the sense amplifier;
a signal divider having an input coupled to an output of the scaling amplifier and an output coupled to the at least one input of the scaling amplifier; and
an analog-to-digital converter (ADC) coupled to the output of the scaling amplifier.

6. The apparatus of claim 3, wherein the summing circuit comprises:
a sense amplifier having an input coupled to the bit line;
an analog-to-digital converter (ADC) coupled to an output of the sense amplifier;
a carry register coupled to at least one output of the ADC;
a carry digital-to-analog converter (DAC) coupled to an output of the carry register; and
a digital accumulator coupled to the at least one output of the ADC.

7. The apparatus of claim 1, wherein values of sequential signals in the first set of signals double in value in ascending order.

8. The apparatus of claim 1, wherein values of sequential signals in the first set of signals double in an order from least significant bit (LSB) to most significant bit (MSB).

9. A method, comprising:
storing ordered bits of a first number in a first set of memory elements that intersect a data line and a first set of access lines;
driving a first set of signals, which correspond to ordered bits of a second number, on the first set of access lines;
receiving a number of output signals from the data line; and
generating a first value equal to the product of the first number and the second number.

10. The method of claim 9, further comprising:
storing ordered bits of a third number in a second set of memory elements that intersect the data line and a second set of access lines;
driving a second set of signals, which correspond to ordered bits of a fourth number, on the second set of access lines;
receiving additional output signals from the data line; and
in response to receiving the additional output signals, generating a second value substantially equal to the product of the first number and the second number added to a product of the third number and the fourth number.

11. The method of claim 9, further comprising:
generating a digital signal in response to receipt of an output signal of the number of output signals;
shifting the digital signal; and
accumulating the shifted digital signal to generate a first value.

12. The method of claim 9, further comprising:
receiving a signal, from a sense amplifier coupled to the data line, at a signal divider and an analog-to-digital converter (ADC);
generating a second signal being a fraction of the signal; and
integrating the second signal with an additional signal from the sense amplifier.

13. A memory system, comprising:
at least one memory device comprising:
a bit line;
a first set of word lines, wherein ordered bits of a first synaptic weight of a first neuron of a neural network layer are stored at respective intersections between the bit line and the first set of word lines; and
a driver configured to drive a first set of signals on the first set of word lines,
wherein the first set of signals correspond to ordered bits of a first input or a first error input of a neural network layer.

14. The memory system of claim 13, wherein the at least one memory device further comprises:
a second set of memory elements at the intersection of the bit line and a second set of word lines;
wherein ordered bits of a second synaptic weight of the first neuron of the neural network layer are stored in the second set of memory elements; and
wherein the driver is further configured to drive a second set of signals on the second set of word lines intersecting the bit line, wherein the second set of signals correspond to ordered bits of a second input or a second error input of the neural network layer.

15. The memory system of claim 14, further comprising a summing circuit configured to generate a first value equal to a product of the first synaptic weight and the first input.

16. The memory system of claim 15, wherein the summing circuit comprises:
an analog-to-digital converter (ADC) configured to receive signals corresponding to the signals on the bit line;
a shift register configured to shift an output of the ADC; and
a digital accumulator configured to receive an output from the shift register and generate the first value or a second value.

17. The memory system of claim 15, wherein the summing circuit comprises:
a sense amplifier coupled to the bit line and configured to generate an amplified signal;
a scaling unit configured to receive the amplified signal and generate a scaled output; and
an analog-to-digital converter (ADC) configured to receive the scaled output and generate the first value equal to the product of the first synaptic weight and the first input.

18. The memory system of claim 15, wherein the summing circuit is configured to:
scale a first signal from the bit line; and
integrate the scaled first signal with a second signal from a bit line.

19. The memory system of claim 15, wherein the summing circuit comprises:
a sense amplifier coupled to the bit line and configured to generate an amplified signal;
an analog-to-digital converter (ADC) configured to receive the amplifier signal and generate a digital signal;

a digital accumulator configured to receive a first portion of the digital signal and a second portion of the digital signal; and a carry digital-to-analog converter (DAC) coupled to an output of the digital accumulator and configured to convey an analog signal to the bit line responsive to receipt of the conveyed signal.

20. The memory system of claim 13, wherein one of:

values of signals in the first set of signals double in value in ascending order; and the values of signals in the first set of signals double in an order from least significant bit (LSB) to most significant bit (MSB).

* * * * *